United States Patent
Kumagawa et al.

(10) Patent No.: US 7,245,890 B2
(45) Date of Patent: Jul. 17, 2007

(54) HIGH FREQUENCY VARIABLE GAIN AMPLIFICATION DEVICE, CONTROL DEVICE, HIGH FREQUENCY VARIABLE GAIN FREQUENCY-CONVERSION DEVICE, AND COMMUNICATION DEVICE

(75) Inventors: Masahiro Kumagawa, Katano (JP); Toshifumi Nakatani, Sakai (JP); Hisashi Adachi, Mino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 352 days.

(21) Appl. No.: 10/895,380

(22) Filed: Jul. 21, 2004

(65) Prior Publication Data

US 2005/0020227 A1   Jan. 27, 2005

(30) Foreign Application Priority Data

Jul. 22, 2003   (JP) .............................. 2003-277618

(51) Int. Cl.
*H04B 1/06* (2006.01)
*H04B 7/00* (2006.01)

(52) U.S. Cl. ................ 455/130; 455/232.1; 455/234.2; 455/248.1; 330/86; 330/96

(58) Field of Classification Search .. 455/134.1–234.2, 455/240.1, 145.1, 246.1, 247.1, 248.1–252.1, 455/341, 63.1; 330/258, 76, 86, 94–95, 96–97, 330/259–260
See application file for complete search history.

(56) References Cited

U.S. PATENT DOCUMENTS

| | | | |
|---|---|---|---|
| 4,066,976 A * | 1/1978 | Dickopp et al. ............... 330/86 |
| 6,114,686 A * | 9/2000 | Funahashi ................ 250/214 A |
| 6,175,279 B1 | 1/2001 | Ciccarelli et al. |
| 6,181,201 B1 | 1/2001 | Black |
| 6,204,728 B1 | 3/2001 | Hageraats |
| 6,388,525 B1 * | 5/2002 | Bien ........................... 330/282 |
| 6,507,242 B1 * | 1/2003 | Palathol Mana Sivadasan et al. ............................ 330/86 |
| 6,873,207 B2 * | 3/2005 | Sakuno ........................ 330/110 |
| 7,088,175 B2 * | 8/2006 | Krupka ......................... 330/69 |
| 2002/0119762 A1 | 8/2002 | Ogihara |
| 2003/0058041 A1 * | 3/2003 | Koizumi ....................... 330/51 |
| 2004/0080366 A1 * | 4/2004 | Ueno et al. ................... 330/86 |

FOREIGN PATENT DOCUMENTS

| | | |
|---|---|---|
| EP | 1 326 347 | 7/2003 |
| JP | 2002-16462 | 1/2002 |
| JP | 2002-536859 | 10/2002 |

* cited by examiner

*Primary Examiner*—Simon Nguyen
(74) *Attorney, Agent, or Firm*—Wenderoth, Lind & Ponack, L.L.P.

(57) ABSTRACT

A high frequency variable gain amplification device 100 includes: a feedback circuit 103 capable of changing a feedback impedance to adjust the gain of an amplifier 101 in accordance with a control signal from a control device 200; and a current consumption adjustment circuit 102 capable of adjusting current consumption of the amplifier 101. The control device 200 controls the feedback impedance and the current consumption based on a desired signal power level and an undesired signal power level. If the desired signal power level exceeds a predetermined value, the control device 200 reduces the feedback impedance to increase the amount of a feedback signal, thereby allowing the amplifier 101 to operate with low gain so as to prevent the distortion characteristic from being reduced and to reduce the current consumption.

15 Claims, 15 Drawing Sheets

F I G. 8
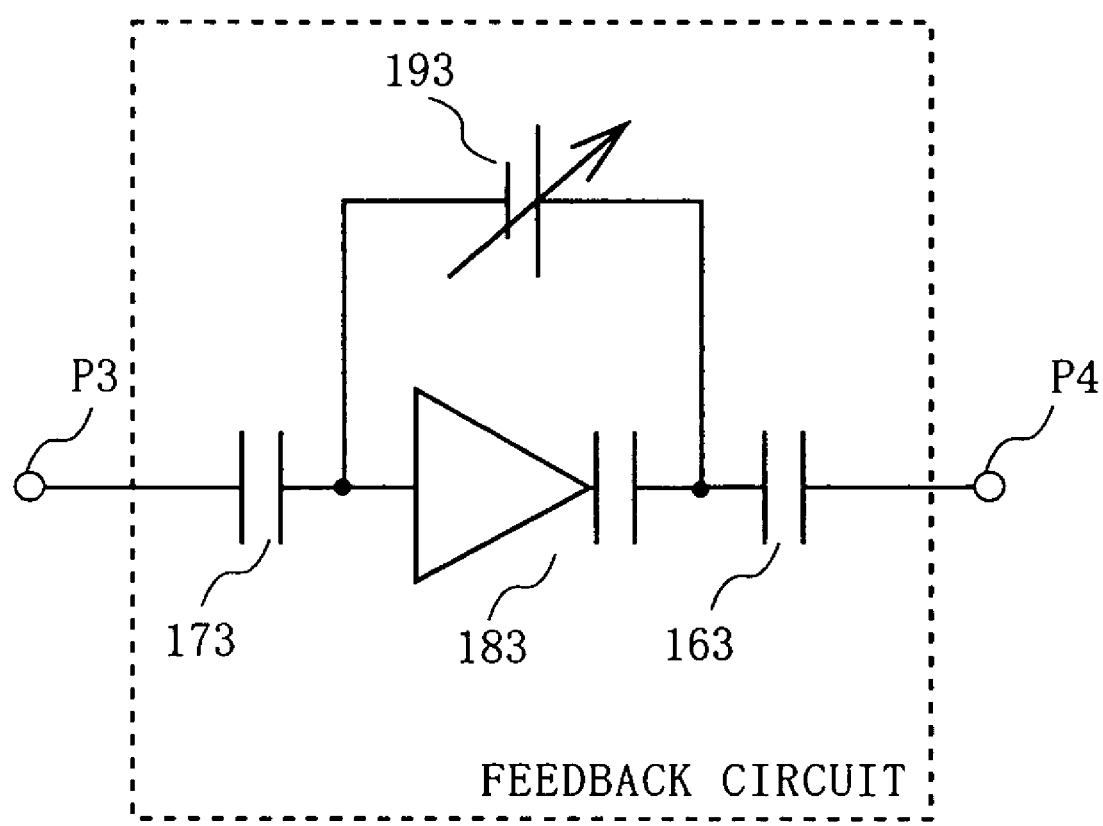

F I G. 1 3
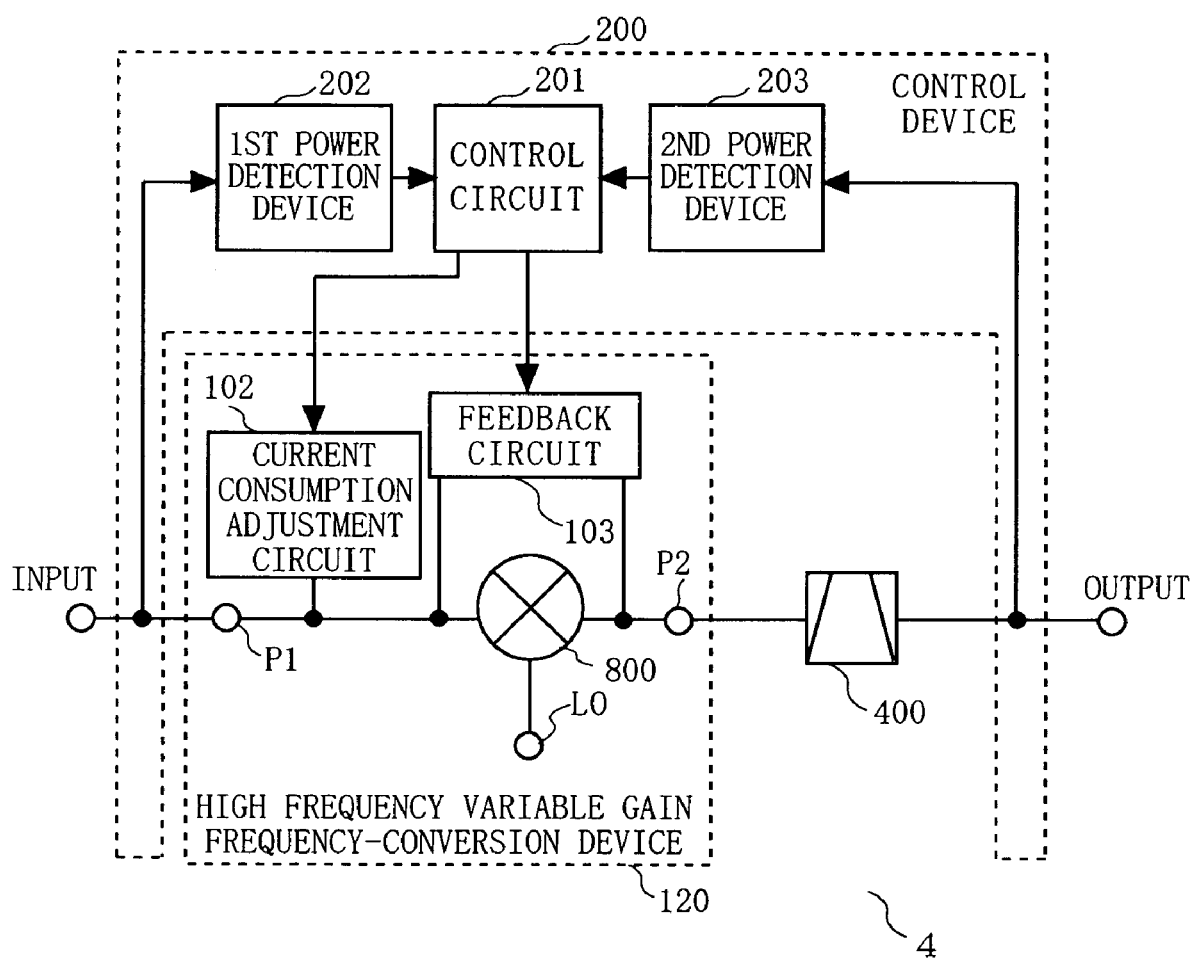

F I G. 1 4
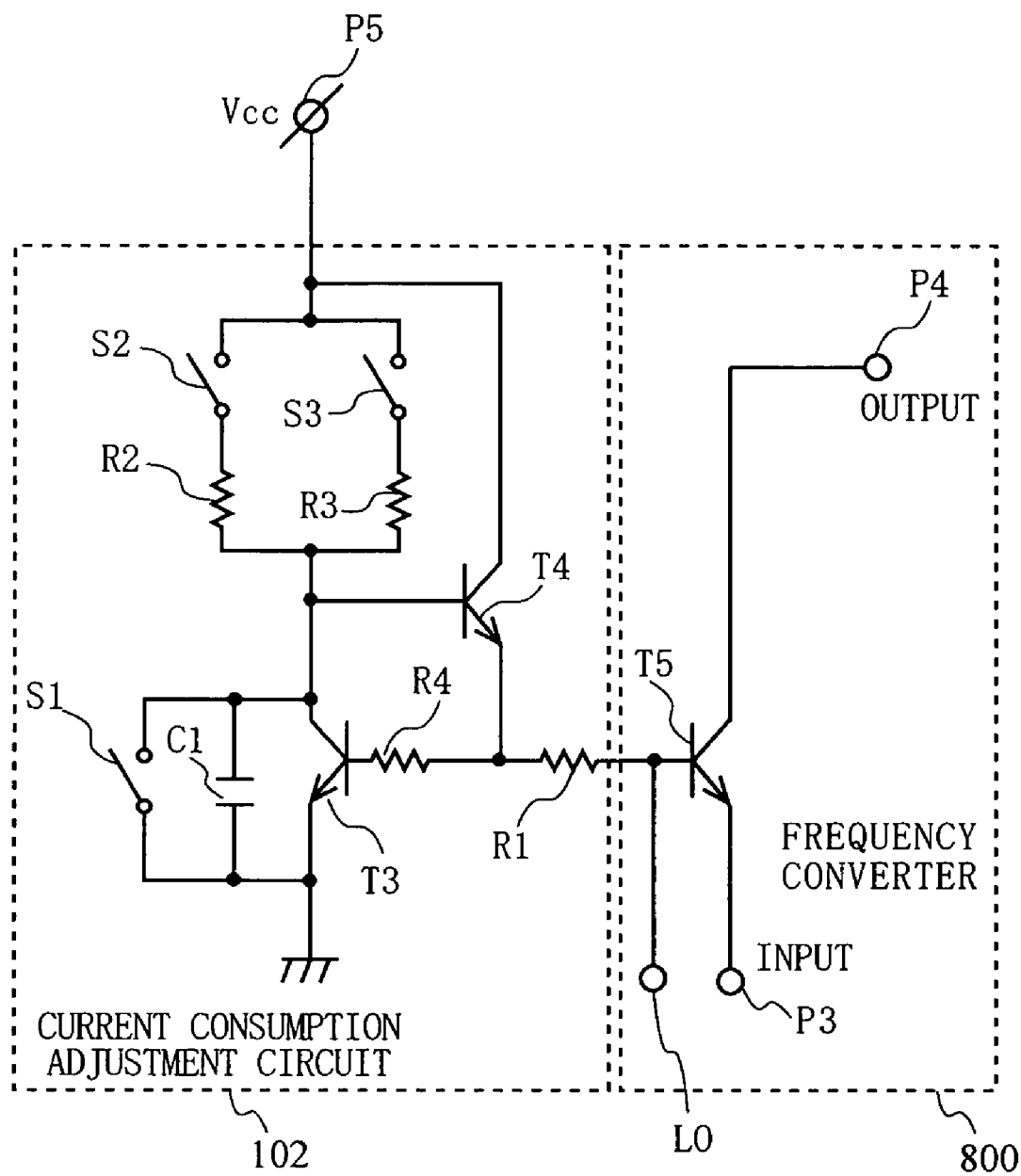

HIGH FREQUENCY VARIABLE GAIN AMPLIFICATION DEVICE, CONTROL DEVICE, HIGH FREQUENCY VARIABLE GAIN FREQUENCY-CONVERSION DEVICE, AND COMMUNICATION DEVICE

BACKGROUND OF THE INVENTION

1. Field of the Invention

The present invention relates to a high frequency variable gain amplification device, a control device, a high frequency variable gain frequency-conversion device, and a communication device. More particularly, the present invention relates to a high frequency variable gain amplification device, a control device, a high frequency variable gain frequency-conversion device, and a communication device which are for use in preventing a distortion characteristic from being reduced during an operation with low gain.

2. Description of the Background Art

In a radio communication system including a receiver unit typified by a mobile telephone, in order for the receiver unit to receive a weak desired signal, a first stage amplifier is required to have a low noise characteristic and a high gain characteristic. Alternatively, in order for the receiver unit to receive a large desired signal, the first stage amplifier is required to have a low gain characteristic and a low distortion characteristic. Particularly, in recent mobile communication, field intensity at reception may vary considerably depending on a distance between a base station and a terminal device. Accordingly, the receiver unit is required to have a large dynamic range. Therefore, a low noise amplifier at a reception front end portion is required to have a gain control function.

In an amplification device having the gain control function, current consumption is increased/decreased so as to cause gain to vary (see, for example, Japanese Laid-Open Patent Publication No. 2002-016462).

FIG. 17 is a diagram showing a structure of a conventional reception circuit 900 having a gain control function which is disclosed in Japanese Laid-Open Patent Publication No. 2002-016462. As shown in FIG. 17, the conventional reception circuit 900 includes an amplification element 901, constant impedance elements 902 and 903, and a variable resistor 904 connected in parallel with the constant impedance element 902. If a level of a received signal is excessively high, the reception circuit 900 increases a resistance value of the variable resistor 904 to reduce current consumption, thereby reducing gain. This reduces an output power for the same input power, resulting in a reduction of third-order intermodulation distortion (IM3).

A similar conventional technique is disclosed in Japanese National Phase PCT Laid-Open Patent Publication No. 2002-536859.

As described above, a conventional reception circuit reduces current consumption in order to reduce IM3. However, the reduction of current consumption reduces the gain of the reception circuit, so that gain of a desired signal is also reduced, resulting in a reduction of a distortion characteristic, e.g., third-order intercept point (IP3), which is obtained by relatively comparing IM3 with the desired signal.

FIGS. 18A and 18B are diagrams used for explaining how third-order output intercept point (OIP3) decreases with reduction of current consumption in a conventional reception circuit. As is shown by transition from point a to point b in FIG. 18A, in the conventional reception circuit, gain is reduced by reducing current consumption. However, as is shown by transition from point a to point b in FIG. 18B, mere reduction of the current consumption results in a reduction of OIP3. Accordingly, third-order distortion increases with an input power level, so that the third-order distortion becomes dominant. As described above, the conventional reception circuit has a problem that reduction of current consumption might reduce a distortion characteristic together with gain. Reducing current consumption is not compatible with preventing the distortion characteristic from being reduced.

A high frequency variable gain frequency-conversion device including an amplification element has a problem similar to the problem as described above.

SUMMARY OF THE INVENTION

Therefore, an object of the present invention is to provide a high frequency variable gain amplification device, a control device, a high frequency variable gain frequency-conversion device, and a communication device, which are capable of preventing a distortion characteristic from being reduced, while reducing current consumption.

The present invention has the following features to attain the object mentioned above.

A first aspect of the present invention is directed to a high frequency variable gain amplification device for causing gain to vary in accordance with a control signal externally provided thereto, and amplifying an input high frequency signal. The high frequency variable gain amplification device includes: an amplifier operable to amplify the input high frequency signal; a feedback circuit operable to cause a feedback impedance to vary in accordance with the control signal, and cause an output signal of the amplifier to be fed back to an input side of the amplifier; and a current consumption adjustment circuit operable to adjust current consumption of the amplifier in accordance with the control signal.

Preferably, the feedback circuit may increase the feedback impedance if a control signal, which indicates that a desired signal power level exceeds a desired signal predetermined value, is inputted, while the feedback circuit may reduce the feedback impedance if a control signal, which indicates that the desired signal power level does not exceed the desired signal predetermined value, is inputted. Preferably, in the case where the desired signal power level exceeds the desired signal predetermined value, if a control signal, which indicates that an undesired signal power level exceeds an undesired signal predetermined value, is inputted, the current consumption adjustment circuit may adjust the current consumption of the amplifier so as not to reduce a distortion characteristic, and if a control signal, which indicates that the undesired signal power level does not exceed the undesired signal predetermined value, is inputted, the current consumption adjustment circuit may reduce the current consumption of the amplifier.

Further, the high frequency variable gain amplification device may further include: an off circuit operable to turn off the amplifier upon receipt of a control signal indicating that the desired signal power level exceeds a predetermined tolerance; and a bypass circuit operable to attenuate the input high frequency signal, while causing the input high frequency signal to bypass the amplifier so as to flow to an output side of the amplifier upon receipt of the control signal indicating that the desired signal power level exceeds the predetermined tolerance.

For example, the feedback circuit may include a plurality of impedance circuits connected in parallel with each other, the plurality of impedance circuits differ in impedance from each other, and each of the plurality of impedance circuits has a switch circuit which is controlled so as to be tuned on or off in accordance with the control signal.

For example, each of the plurality of impedance circuits may be a parallel circuit including a resistor and a capacitor which are connected in parallel with each other, the plurality of impedance circuits differ from each other with respect to a resistance value of the resistor, and a feedback signal is reversed in phase by the parallel circuit.

For example, the switch circuit may include two switches connected to either end of the impedance circuit, and the two switches are simultaneously turned off or on in accordance with the control signal.

For example, the feedback circuit may include a variable-capacitance diode, and the feedback impedance is adjusted by adjusting a reverse bias voltage of the variable-capacitance diode.

For example, the amplifier may include first and second bipolar transistors, a collector of the first bipolar transistor is connected to an emitter of the second bipolar transistor, and an input signal inputted into a base of the first bipolar transistor is outputted from a collector of the second bipolar transistor.

For example, the current consumption adjustment circuit may include a plurality of impedance circuits connected in parallel with each other, the plurality of impedance circuits differ in impedance from each other, and each of the plurality of impedance circuits has a switch circuit which is controlled so as to be tuned on or off in accordance with the control signal.

A second aspect of the present invention is directed to a control device for controlling a high frequency variable gain amplification device including an amplifier and a feedback circuit operable to cause an output signal of the amplifier to be fed back to an input side of the amplifier, the high frequency variable gain amplification device capable of adjusting current consumption of the amplifier and an impedance of the feedback circuit. The control device includes: a desired signal power level detection unit operable to detect a desired signal power level of a high frequency signal inputted into the high frequency variable gain amplification device; an undesired signal power level detection unit operable to detect an undesired signal power level of an undesired component contained in an output signal from the high frequency variable gain amplification device; a feedback impedance control unit operable to control a feedback impedance of the high frequency variable gain amplification device in accordance with the desired signal power level detected by the desired signal power level detection unit; and a current consumption control unit operable to control the current consumption of the high frequency variable gain amplification device in accordance with the undesired signal power level detected by the undesired signal power level detection unit. If the desired signal power level exceeds a desired signal predetermined value, the feedback impedance control unit controls the high frequency variable gain amplification device so as to increase the feedback impedance, and if the desired signal power level does not exceed the desired signal predetermined value, the feedback impedance control unit controls the high frequency variable gain amplification device so as to reduce the feedback impedance. In the case where the desired signal power level exceeds the desired signal predetermined value, if the undesired signal power level exceeds an undesired signal predetermined value, the current consumption control unit controls the high frequency variable gain amplification device so as to decrease the current consumption to such an extent as not to reduce a distortion characteristic, and if the undesired signal power level does not exceed the undesired signal predetermined value, the current consumption control unit controls the high frequency variable gain amplification device so as to reduce the current consumption.

Preferably, the control device may further include: an off unit operable to turn off the high frequency variable gain amplification device if the desired signal power level exceeds a predetermined tolerance; and a bypass unit operable to attenuate an input signal, while causing the input signal to bypass the amplifier so as to flow to an output side of the amplifier, if the desired signal power level exceeds the predetermined tolerance.

A third aspect of the present invention is directed to a high frequency variable gain frequency-conversion device for causing gain to vary in accordance with a control signal externally provided thereto, and thereby frequency-converting an input high frequency signal. The high frequency variable gain frequency-conversion device includes: a frequency converter operable to frequency-convert the input high frequency signal; a feedback circuit operable to cause a feedback impedance to vary in accordance with the control signal, and cause an output signal of the frequency converter to be fed back to an input side of the frequency converter; and a current consumption adjustment circuit operable to adjust current consumption of the frequency converter in accordance with the control signal.

A fourth aspect of the present invention is directed to a communication device for receiving a high frequency signal, which includes a high frequency variable gain amplification device operable to amplify a high frequency signal received by an antenna of the communication device and to output the amplified high frequency signal. The high frequency variable gain amplification device may be any one of the above-described high frequency variable gain amplification devices.

Further, the communication device may further include: a frequency converter operable to frequency-convert an output signal from the high frequency variable gain amplification device; and a variable gain amplification device operable to adjust gain of an output signal from the frequency converter to a predetermined level.

A fifth aspect of the present invention is directed to a communication device for receiving a high frequency signal, including: a high frequency variable gain amplification device operable to amplify a high frequency signal received by an antenna of the communication device and to output the amplified high frequency signal; and a high frequency variable gain frequency-conversion device operable to frequency-convert an output signal from the high frequency variable gain amplification device. The high frequency variable gain frequency-conversion device may be the same as that described above.

In the high frequency variable gain amplification device, the high frequency variable gain frequency-conversion device, and the control device of the present invention, the feedback impedance is adjusted to adjust the amount of a feedback signal, thereby adjusting the gain of an amplifier. The feedback impedance is increased to reduce the gain, thereby improving the distortion characteristic. Accordingly, if the current consumption is reduced with the gain, the distortion characteristic is not reduced. Therefore, it is possible to provide a high frequency gain amplification device capable of preventing the distortion characteristic from being reduced, while reducing the current consumption. Moreover, it is also possible to provide a high frequency gain amplification device capable of improving the distortion characteristic without increasing the current consumption.

Further, in the case where the high frequency variable gain amplification device further includes a bypass circuit, if a desired signal power level exceeds a tolerance, a desired signal is caused to bypass an amplifier so as to flow to an output side of the amplifier. Accordingly, it is possible to prevent distortion from being generated due to saturation caused by input overload.

If the feedback circuit includes switches and a plurality of impedance circuits which are connected in parallel with each other and differ in impedance from each other, the impedance of the feedback circuit can be adjusted by selectively turning on the switches. If each of the plurality of impedance circuits is a parallel circuit including a resistor and a capacitor which are connected in parallel with each other, it is possible to reverse the phase of the feedback signal to cancel an undesired signal. Further, if the impedance circuit is provided between two switches, it is possible to reduce the influence of thermal noise. Furthermore, if the feedback circuit includes a variable-capacitance diode, it is possible to minutely adjust the feedback impedance.

First and second bipolar transistors, which are connected to an amplifier in a cascode configuration, may be used to amplify a high frequency signal. In the case where a base potential of the second bipolar transistor is approximately zero, it is possible to cause the second bipolar transistor not to operate even if a signal of high field intensity is inputted to the first bipolar transistor.

If the current consumption adjustment circuit includes switches and a plurality of impedance circuits which are connected in parallel with each other and differ in impedance from each other, the current consumption of the amplifier can be adjusted by selectively turning on the switches.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing still another exemplary structure of the feedback circuit;

FIG. 13 is a block diagram showing a structure of a frequency conversion circuit 4 according to a fourth embodiment of the present invention;

FIG. 14 is a circuit diagram showing an internal structure of each of a frequency converter 800 and the current consumption adjustment circuit 102;

DESCRIPTION OF THE PREFERRED EMBODIMENTS

First Embodiment

Figure 1:
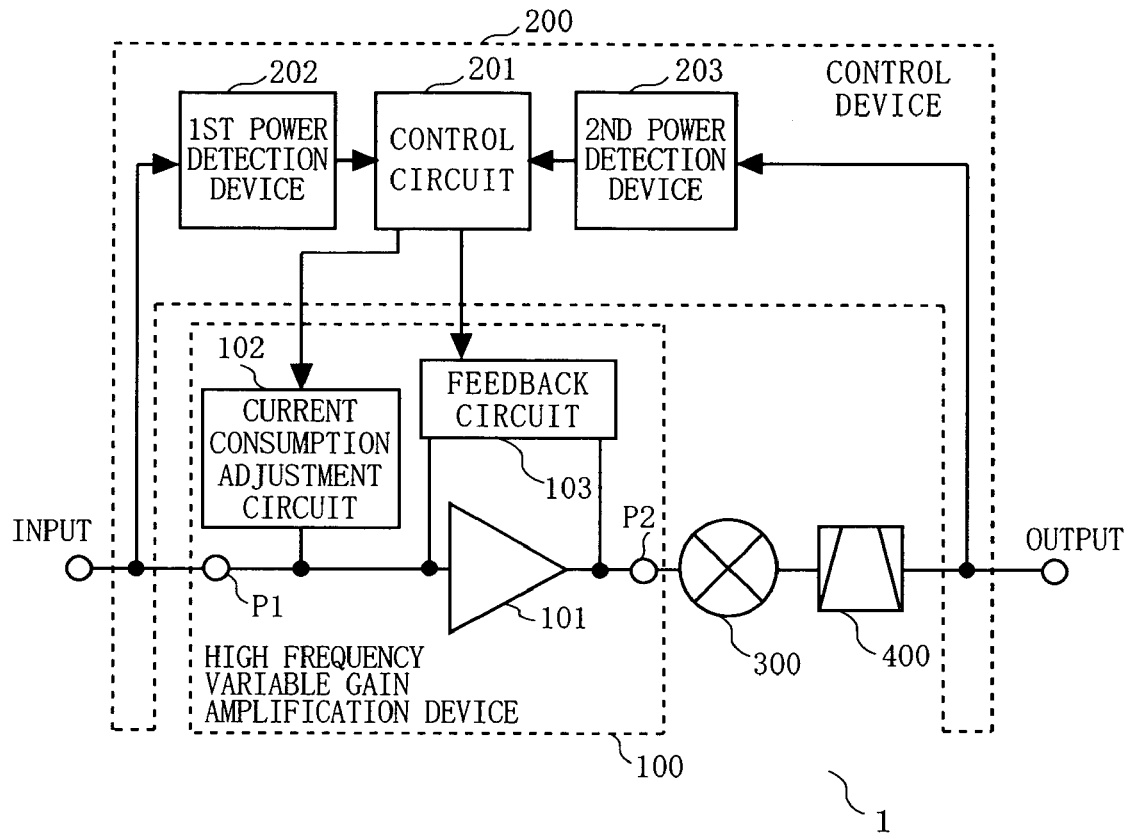
FIG. 1 is a block diagram showing a structure of an amplification circuit 1 according to a first embodiment of the present invention.

FIG. 1 is a block diagram showing a structure of an amplification circuit 1 according to a first embodiment of the present invention. The amplification circuit 1 shown in FIG. 1 is of a so-called heterodyne type, and includes a high frequency variable gain amplification device 100, a control device 200, a frequency converter 300, and a channel selection filter 400.

The high frequency variable gain amplification device 100 is operable to amplify an input signal and output the amplified signal. The control device 200 is operable to control current consumption and gain of the high frequency variable gain amplification device 100 based on a power level of a desired signal and a power level of an undesired signal. The frequency converter 300 is operable to frequency-convert and output the amplified signal outputted from the high frequency variable gain amplification device 100. The channel selection filter 400 is a band limiting filter operable to allow desired signal components of the signal outputted by the frequency converter 300 to pass therethrough, and to attenuate undesired signal components of the same signal.

The high frequency variable gain amplification device 100 includes an input terminal P1, an output terminal P2, an amplifier 101, a current consumption adjustment circuit 102, and a feedback circuit 103. The amplifier 101 is a circuit including a transistor, etc., and operable to amplify an input signal. The current consumption adjustment circuit 102 is operable to adjust current consumption of the amplifier 101.

The feedback circuit 103 is operable to feed back an output signal of the amplifier 101 to an input side of the amplifier 101. The feedback circuit 103 adjusts its impedance (hereinafter, referred to as a "feedback impedance") in accordance with a control signal outputted from the control device 200, thereby controlling the gain of the high frequency variable gain amplification device 100.

The control device 200 includes a control circuit 201, a first power detection device 202, and a second power detection device 203. The first power detection device 202 is operable to detect a power level of an input signal. The power level detected by the first power detection device 202 corresponds to the sum of a desired signal power level and an undesired signal power level at an input end of the high frequency variable gain amplification device 100. The second power detection device 203 is operable to detect a power level at an output end of the high frequency variable gain amplification device 100. The power level detected by the second power detection device 203 corresponds to the sum of a power level of a desired signal amplified by the high frequency variable gain amplification device 100 and a power level of an undesired signal attenuated by the channel selection filter 400.

The control circuit 201 is operable to calculate an absolute value of the desired signal at the input end of the high frequency variable gain amplification device 100 and an absolute value of the undesired signal at the output end of the high frequency variable gain amplification device 100 based on the power levels detected by the first and second power detection devices 202 and 203. Based on a calculation result, the control circuit 201 transmits a control signal for controlling current consumption to the current consumption adjustment circuit 102, and transmits a control signal for controlling the feedback impedance to the feedback circuit 103, thereby controlling the current consumption and gain of the high frequency variable gain amplification device 100.

Figure 2:
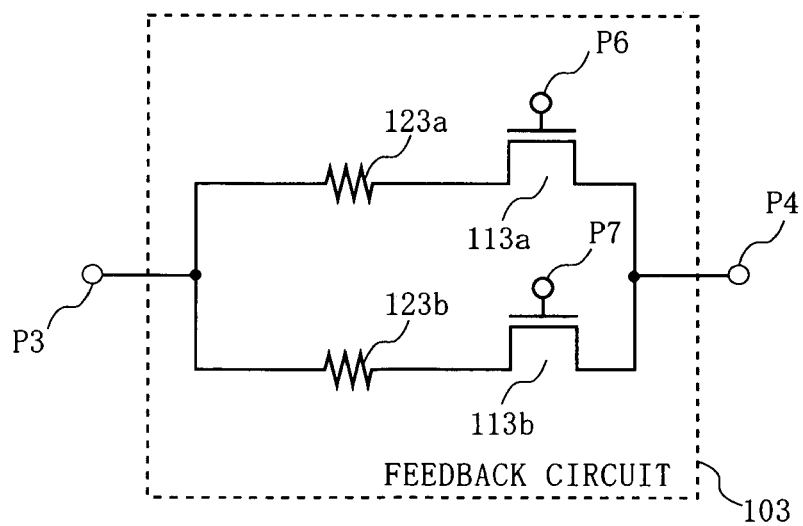
FIG. 2 is a circuit diagram showing an internal structure of a feedback circuit 103.

FIG. 2 is a circuit diagram showing an internal structure of the feedback circuit 103. In FIG. 2, the feedback circuit 103 includes first and second switches 113a and 113b, and first and second resistors 123a and 123b. The first switch 113a and the first resistor 123a are connected in series with each other to form an impedance circuit. The second switch 113b and the second resistor 123b are connected in series with each other to form another impedance circuit. These impedance circuits are connected in parallel with each other. A terminal P3 is connected to the input side of the amplifier 101. A terminal P4 is connected to an output side of the amplifier 101. In the following descriptions, an impedance value of the first resistor 123a is assumed to be less than an impedance value of the second resistor 123b.

The control circuit 201 controls on/off of the first and second switches 113a and 113b in order to adjust the feedback impedance of the entire feedback circuit 103. The feedback impedance can be adjusted in three levels. In the following descriptions, a feedback impedance in a first level is assumed to be the highest, and the feedback impedance is decreased in the order of second and third levels.

If it is desired to increase the feedback impedance to the first level, the control circuit 201 transmits a signal to a switch control terminal P6 to turn off the first switch 113a, and further transmits a signal to a switch control terminal P7 to turn off the second switch 113b. This allows the feedback impedance of the entire feedback circuit 103 to become considerably larger than an input impedance of the amplifier 101. As a result, a feedback signal from the output side to the input side of the amplifier 101 is substantially eliminated, and therefore the gain of the amplifier 101 is maximized. The value of the maximized gain is assumed to be G1.

If it is desired to reduce the feedback impedance from the first level to the second level, the control circuit 201 transmits a signal to the switch control terminal P6 to turn off the first switch 113a, and further transmits a signal to the switch control terminal P7 to turn on the second switch 113b. As a result, the feedback impedance of the entire feedback circuit 103 is reduced to a value equal to only an impedance of the second resistor 123b. The reduction of the feedback impedance increases the amount of the feedback signal, and therefore reduces the gain of the amplifier 101. In this case, the value of the gain of the amplifier 101 is assumed to be G2 (G2<G1).

If it is desired to further reduce the feedback impedance from the second level to the third level, the control circuit 201 transmits a signal to the switch control terminal P6 to turn on the first switch 113a, and further transmits a signal to the switch control terminal P7 to turnoff the second switch 113b. As a result, the feedback impedance of the entire feedback circuit 103 is reduced to a value equal to only an impedance of the first resistor 123a. The reduction of the feedback impedance increases the amount of the feedback signal, and therefore reduces the gain of the amplifier 101. In this case, the value of the gain of the amplifier 101 is assumed to be G3 (G3<G2<G1).

Figure 3:
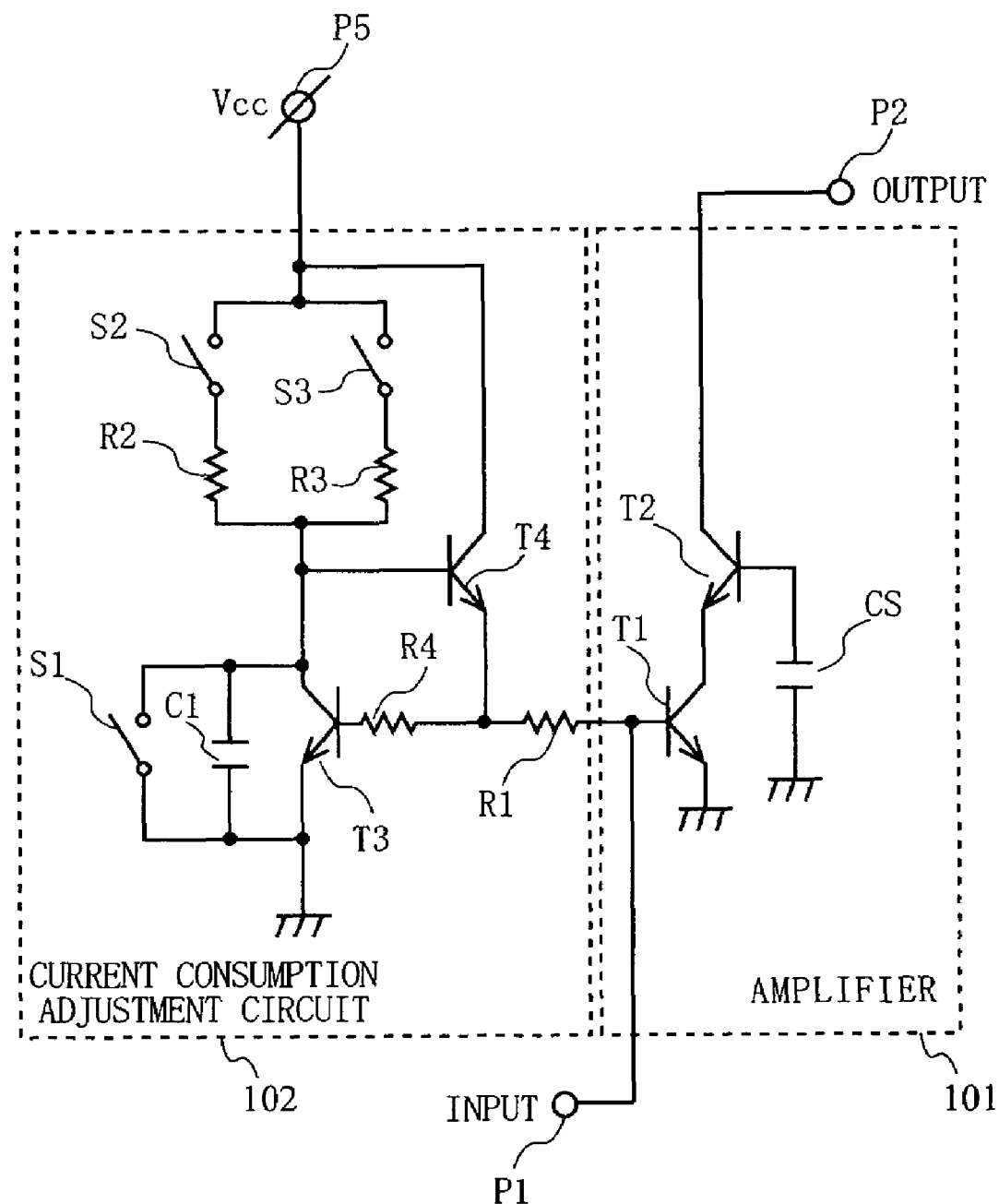
FIG. 3 is a circuit diagram showing an internal structure of each of an amplifier 101 and a current consumption adjustment circuit 102.

FIG. 3 is a circuit diagram showing an internal structure of each of the amplifier 101 and the current consumption adjustment circuit 102. In FIG. 3, the amplifier 101 includes a first bipolar transistor T1, a second bipolar transistor T2, and a ground capacitor CS. A base of the bipolar transistor T1 is connected to the input terminal P1. An emitter of the bipolar transistor T1 is grounded. A collector of the bipolar transistor T1 is connected to an emitter of the second bipolar transistor T2. A collector of the second bipolar transistor T2 is connected to the output terminal P2. At high frequencies, a base of the second bipolar transistor T2 is grounded via the ground capacitor CS. In this manner, the first and second bipolar transistors T1 and T2 are connected together in a cascode configuration.

Note that at least one of the first and second bipolar transistors T1 and T2 may be a field-effect transistor (FET).

In FIG. 3, the current consumption adjustment circuit 102 includes a third bipolar transistor T3, a fourth bipolar transistor T4, first through fourth resistors R1 through R4, a first capacitor C1, and first through third DC switches S1 through S3. In the example shown in FIG. 3, a resistance value of the second resistor R2 is assumed to be greater than a resistance value of the third resistor R3.

The first resistor R1 is connected at one end to the base of the first bipolar transistor T1 and at the other end to one end of the fourth resistor R4 and an emitter of the fourth bipolar transistor T4. The other end of the fourth resistor R4 is connected to a base of the third bipolar transistor T3. An emitter of the third bipolar transistor T3 is grounded. The first capacitor C1 and the first DC switch S1 are connected in parallel between a collector of the third bipolar transistor T3 and the emitter of the third bipolar transistor T3. The collector of the third bipolar transistor T3 is connected to a base of the fourth bipolar transistor T4. A series circuit formed by the second resistor R2 and the second DC switch S2 and a series circuit formed by the third resistor R3 and the third DC switch S3 are connected in parallel between the collector of the third bipolar transistor T3 and a power supply terminal P5. For example, each of the first through third DC switches S1 through S3 is an n-channel FET switch. The emitter of the fourth bipolar transistor T4 is connected between the first and fourth resistors R1 and R4. A collector of the fourth bipolar transistor T4 is connected to the power supply terminal P5. Note that the terminal P3 of the feedback circuit 103 is connected between the input terminal P1 and the base of the first bipolar transistor T1. The terminal P4 is connected between the output terminal P2 and the collector of the second bipolar transistor T2.

The control circuit 201 controls on/off of the second and third DC switches S2 and S3 in order to adjust current consumption of the amplifier 101. The current consumption can be adjusted in three levels. In the following descriptions, a current consumption in a first level is assumed to be the highest, and the current consumption is decreased in the order of second and third levels. It is assumed that in an initial state, the current consumption is in the second level, and the first DC switch S1 is in an off state. Note that the first DC switch S1 may not be provided.

If it is desired to increase the current consumption to the first level, the control circuit 201 turns on the second DC switch S2, and also turns on the third DC switch S3. As a result, an impedance of a parallel circuit including the second and third resistors R2 and R3 is reduced to less than an impedance of each of the second and third resistors R2 and R3. A reduction of the impedance of the parallel circuit increases the amount of current flowing through the base of the first bipolar transistor T1, whereby it is possible to increase the current consumption of the amplifier 101.

If it is desired to reduce the current consumption from the first level to the second level, the control circuit 201 turns off the second DC switch S2, and turns on the third DC switch S3. As a result, the impedance of the entire parallel circuit including the second and third resistors R2 and R3 is increased to a value equal to an impedance of the third resistor R3. The increase of the impedance reduces the amount of current flowing through the base of the first bipolar transistor T1, and therefore reduces the current consumption of the amplifier 101.

If it is desired to reduce the current consumption from the second level to the third level, the control circuit 201 turns on the second DC switch S2, and turns off the third DC switch S3. As a result, the impedance of the entire parallel circuit including the second and third resistors R2 and R3 is increased to a value equal to an impedance of the second resistor R2. The increase of the impedance further reduces the amount of current flowing through the base of the first bipolar transistor T1, and therefore further reduces the current consumption of the amplifier 101.

Figure 4:
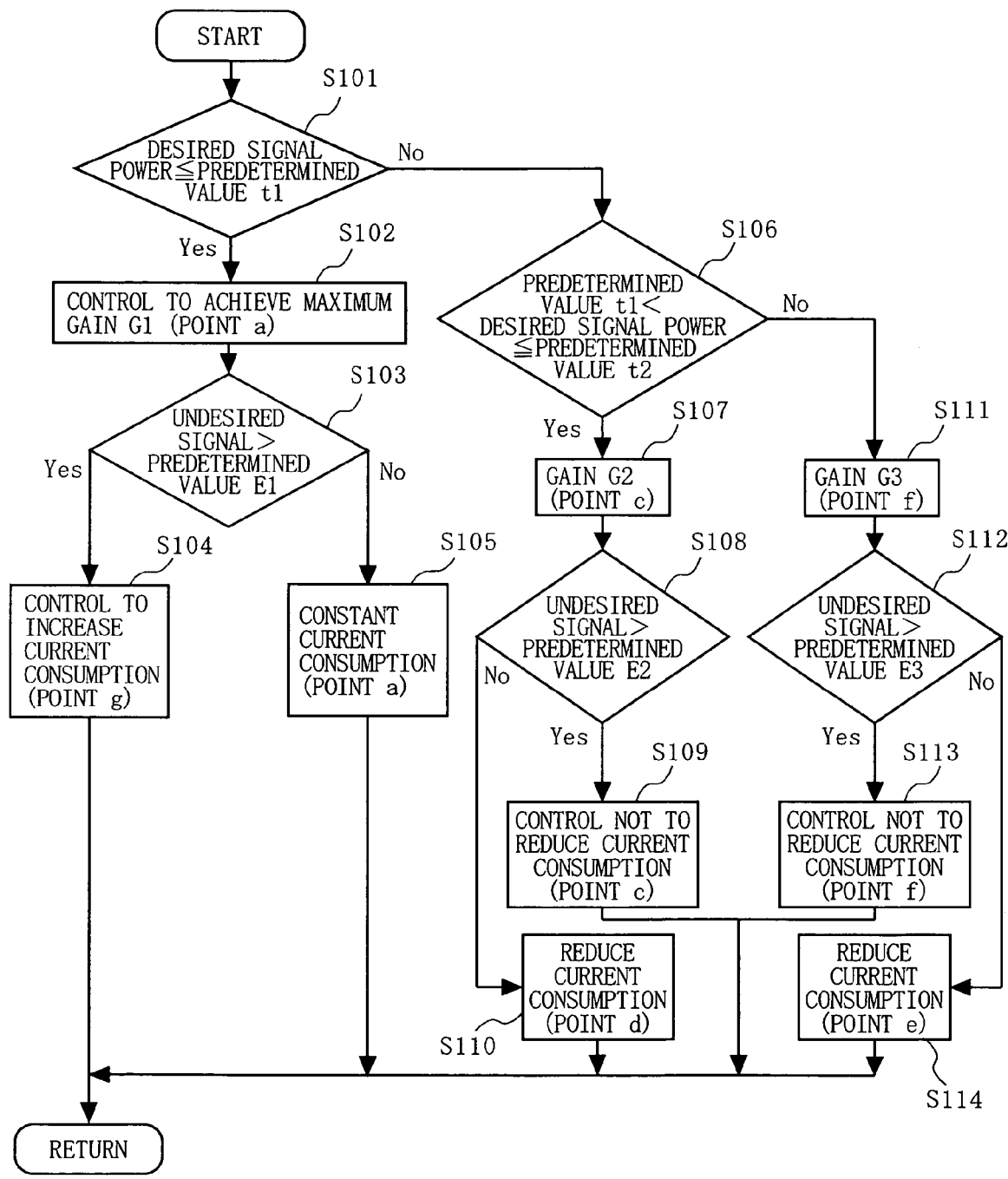
FIG. 4 is a flowchart showing an operation of a control circuit 201 according to the first embodiment.
Figure 5A:
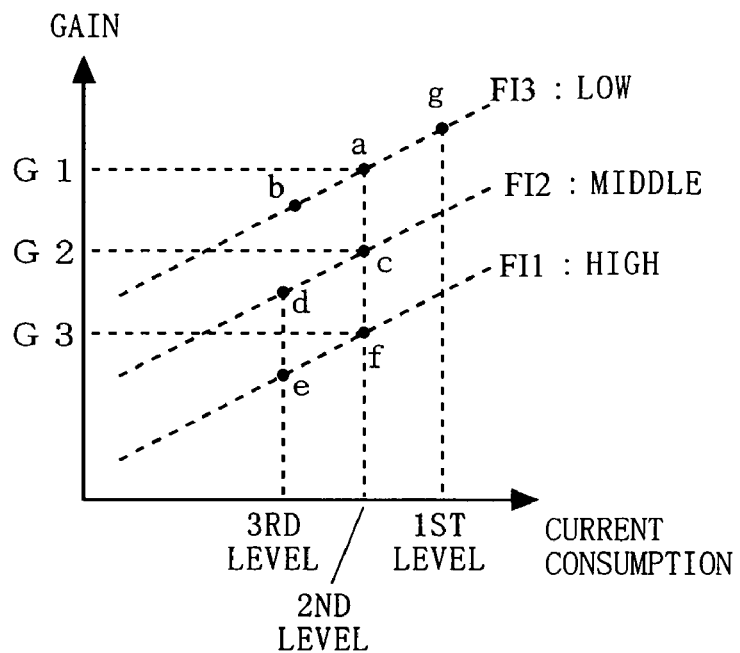
FIG. 5A is a graph showing transition of the gain of the amplifier 101 controlled in accordance with the flowchart of FIG. 4.
Figure 5B:
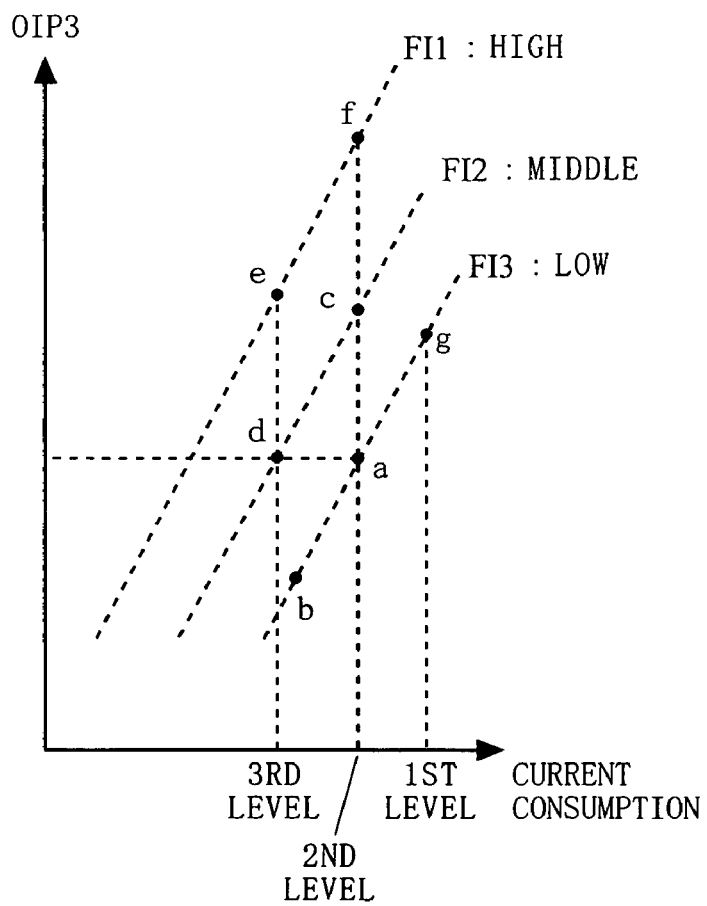
FIG. 5B is a graph showing transition of OIP3 of the amplifier 101 controlled in accordance with the flowchart of FIG. 4.
Figure 18A:
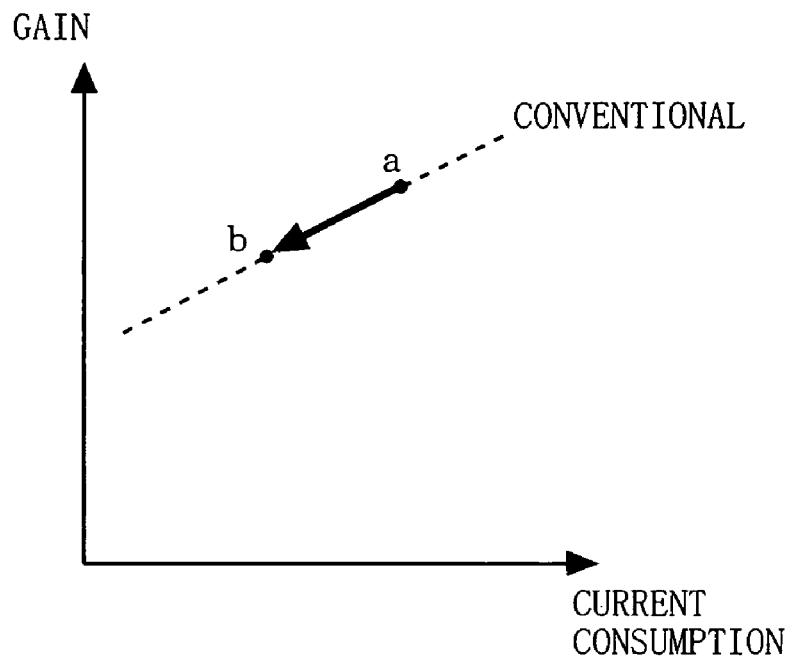
FIG. 18A is a diagram used for explaining how OIP3 decreases with reduction of current consumption in a conventional reception circuit.
Figure 18B:
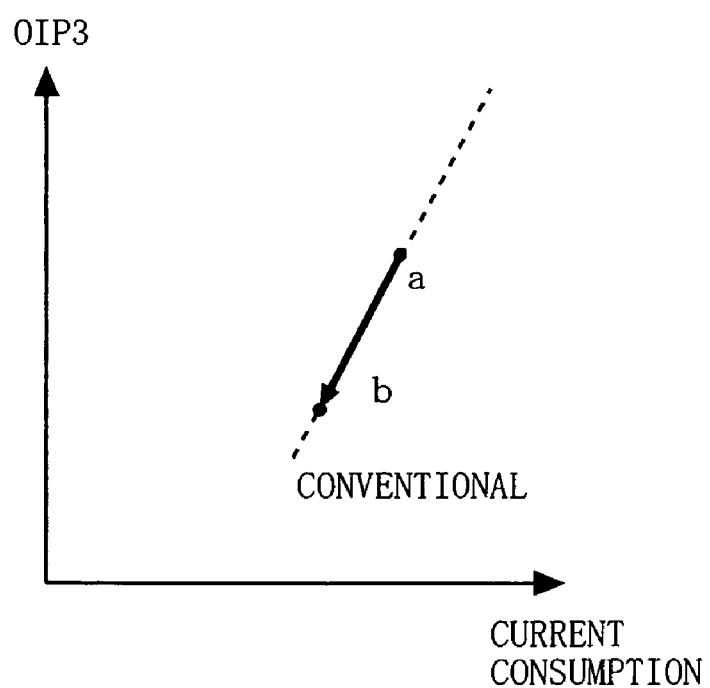
FIG. 18B is another diagram used for explaining how OIP3 decreases with reduction of current consumption in a conventional reception circuit.

FIG. 4 is a flowchart showing an operation of the control circuit 201 according to the first embodiment. FIG. 5A is a graph showing transition of the gain of the amplifier 101 controlled in accordance with the flowchart of FIG. 4. FIG. 5B is a graph showing transition of OIP3 of the amplifier 101 controlled in accordance with the flowchart of FIG. 4. Note that for better understanding of differences from the example of the conventional circuit described in connection with FIGS. 18A and 18B, the gain and OIP3 of the conventional circuit are respectively indicated in FIGS. 5A and 5B by point b. Moreover, in FIGS. 5A and 5B, feedback impedances in the first through third levels are indicated by FI1, FI2, and FI3, respectively, and three degrees of levels are represented by HIGH, MIDDLE, and LOW. Hereinbelow, a method for controlling the high frequency variable gain amplification device 100 is described with reference to FIGS. 4, 5A, and 5B.

Initially, the control circuit 201 calculates a desired signal power level on the input side based on an input side power level detected by the first power detection device 202, an output side power level detected by the second power detection device 203, an amplification factor of the amplifier 101, and an attenuation factor of the channel selection filter 400. Specifically, the control circuit 201 multiplies the input side power level by the amplification factor and the attenuation factor. The resultant product is subtracted from the output side power level, thereby obtaining an undesired signal power level on the output side. The obtained undesired signal power level on the output side is then multiplied by a reciprocal of the amplification factor and a reciprocal of the attenuation factor, thereby performing an inverse calculation to obtain an undesired signal power level on the input side. The obtained undesired signal power level on the input side is then subtracted from the input side power level, thereby detecting the desired signal power level on the input side. Then, the control circuit 201 determines whether the obtained desired signal power level on the input side is less than or equal to a predetermined value t1 (step S101 of FIG. 4). Hereinafter, the predetermined value t1 is interchangeably referred to as a "first desired signal predetermined value". If the desired signal power level on the input side is less than or equal to the prescribed value t1, a received signal is required to be amplified with high gain, and therefore the control circuit 201 controls the feedback circuit 103 so as to increase the gain of the amplifier 101 (step S102).

Note that a filter for allowing only the desired signal to pass therethrough may be provided on the input side, such that the first power detection device 202 calculates a power level of a signal passing through the filter, thereby calculating the desired signal power level.

Specifically, in step S102, in order to reduce the feedback impedance to a minimum level, i.e., the third level, the control circuit 201 transmits to the switch control terminal P6 a control signal for turning off the first switch 113a of the feedback circuit 103, and also transmits to the switch control terminal P7 a control signal for turning off the second switch 113b of the feedback circuit 103. As a result, the gain of the amplifier 101 increases to G1. In this case, the gain and OIP3 of the amplifier 101 are respectively as indicated in FIGS. 5A and 5B by point a.

Next, the control circuit 201 subtracts, from the output side power level detected by the second power detection device 203, a value obtained in step S101 by multiplying the desired signal power level on the input side by the amplification factor of the amplifier 101, thereby obtaining an undesired signal power level (typically, the third-order intermodulation distortion (IM3)) on the output side to determine whether the obtained undesired signal power level exceeds a predetermined value E1 (step S103). Hereinafter, the predetermined value E1 is interchangeably referred to as a "first undesired signal predetermined value".

In the case where the obtained undesired signal power level exceeds the predetermined value E1, in order to improve a distortion characteristic, the control circuit 201 controls the current consumption adjustment circuit 102 so as to increase current consumption of the amplifier 101 (step S104), and then the procedure returns to step S101.

Specifically, in step S104, the control circuit 201 turns on both the second and third switches S2 and S3 of the current consumption adjustment circuit 102 so as to increase the current consumption to the first level. This increases the current consumption of the amplifier 101, thereby improving the distortion characteristic. In this case, the gain and OIP3 of the amplifier 101 are respectively as indicated in FIGS. 5A and 5B by point g. As is apparent from FIGS. 5A and 5B, the gain and OIP3 increase with the current consumption.

In the case where the above obtained undesired signal power level does not exceed the predetermined value E1, the control circuit 201 controls the current consumption adjustment circuit 102 so as to keep the current consumption constant (step S105), and then the procedure returns to step S101. In this case, each of the gain and OIP3 of the amplifier 101 remains at point a in FIGS. 5A and 5B. Specifically, the control circuit 201 operates to maintain states of the second and third DC switches S2 and S3 of the current consumption adjustment circuit 102.

If it is determined in step S101 that the desired signal power level on the input side exceeds the predetermined value t1, then the control circuit 201 determines whether the desired signal power level on the input side is less than or equal to a predetermined value t2 (step S106). Hereinafter, the predetermined value t2 is interchangeably referred to as a "second desired signal predetermined value".

If the desired signal power level on the input side is less than or equal to the predetermined value t2, the control circuit 201 controls the feedback circuit 103 such that the gain of the amplifier 101 becomes G2 (G1>G2) (step S107). Specifically, in order to change the level of the feedback impedance to the second level, the control circuit 201 transmits a control signal for turning off the first switch 113a of the feedback circuit 103 to the switch control terminal P6, and also transmits a control signal for turning on the second switch 113b of the feedback circuit 103 to the switch control terminal P7. In comparison to a case where both the first and second switches 113a and 113b are turned off, the feedback circuit 103 has a great impedance value, and therefore it is possible to set the gain of the amplifier 101 so as to be G2 which is less than G1. In this case, the gain and OIP3 of the amplifier 101 are respectively as indicated in FIGS. 5A and 5B by at point c. As is apparent from FIG. 5B, OIP3 is improved by using feedback.

Next, the control circuit 201 determines whether the above obtained undesired signal power level exceeds a predetermined value E2 (step S108). Hereinafter, the predetermined value E2 is interchangeably referred to as a "second undesired signal predetermined value". In the case where the undesired signal power level exceeds the predetermined value E2, a more satisfactory distortion characteristic is required (i.e., OIP3 is required to be greater). Accordingly, the control circuit 201 controls the current consumption adjustment circuit 102 so as not to reduce the current consumption (step S109), and then the procedure returns to step S101. Specifically, the control circuit 201 operates to maintain the states of the second and third DC switches S2 and S3 of the current consumption adjustment circuit 102. In this case, each of the gain and OIP3 of the amplifier 101 remains at point c in FIGS. 5A and 5B.

In the case where the undesired signal power level does not exceed the predetermined value E2, the distortion characteristic is satisfactory. Accordingly, the control circuit 201 controls the current consumption adjustment circuit 102 so as to reduce the current consumption (step S110), and then the procedure returns to step S101. Specifically, in order to reduce the current consumption to the third level, the control circuit 201 turns on the second DC switch S2, and turns off the third DC switch S3. In this case, the gain and OIP3 of the amplifier 101 are respectively as indicated in FIGS. 5A and 5B by point d. Specifically, the gain is reduced as shown in FIG. 5A, while OIP3 is maintained at the same level as that of point a as shown in FIG. 5B. Accordingly, the second resistor R2 is only required to have such an impedance value as to reduce the current consumption to the extent that the level of OIP3 is not reduced. Note that in the case where the desired signal power level on the input side is high, no practical problem is caused by reducing the gain of the high frequency variable gain amplification device 100.

If it is determined in step S106 that the desired signal power level on the input exceeds the predetermined value t2, the control circuit 201 controls the feedback circuit 103 such that the gain of the amplifier 101 becomes G3 (G2>G3) (step S111). Specifically, in order to increase the feedback impedance to the first level, the control circuit 201 transmits a control signal for turning on the first switch 113a to the switch control terminal P6, and also transmits a control signal for turning off the second switch 113b to the switch control terminal P7. This increases the gain of the amplifier 101 to G3. In this case, the gain and OIP3 are respectively as indicated in FIGS. 5A and 5B by point f. As is apparent from FIG. 5B, OIP3 is sharply increased.

Next, the control circuit 201 determines whether the undesired signal power level exceeds a predetermined value E3 (E2<E3) (step S112). Hereinafter, the predetermined value E3 is interchangeably referred to as a "third undesired predetermined value". If the undesired signal power level exceeds the predetermined value E3, a more satisfactory characteristic is required. Accordingly, the control circuit 201 controls the current consumption adjustment circuit 102 so as not to reduce the current consumption (step S113), and then the procedure returns to step S101. Specifically, the control circuit 201 operates to maintain the states of the second and third DC switches S2 and S3 of the current consumption adjustment circuit 102. In this case, each of the gain and OIP3 of the amplifier 101 remains at point f in FIGS. 5A and 5B.

In the case where the undesired signal power level does not exceed the predetermined value E3, the distortion characteristic is satisfactory. Accordingly, the control circuit 201 controls the current consumption adjustment circuit 102 so as to reduce the current consumption (step S114), and then the procedure returns to step S101. Specifically, in order to reduce the current consumption to the third level, the control circuit 201 turns on the second DC switch S2, and turns off the third DC switch S3. In this case, the gain and OIP3 of the amplifier 101 are respectively as indicated in FIGS. 5A and 5B by point e. Specifically, the gain is reduced as shown in FIG. 5A, while OIP3 is maintained at the same level as that of point a as shown in FIG. 5B. Accordingly, each of the second and third resistors R2 and R3 is only required to have such an impedance value as to maintain OIP3 at the same level as that of point a after the current consumption is reduced to the third level.

As described above, in the first embodiment, the feedback impedance is controlled in accordance with a power level of a received desired signal, thereby adjusting a gain of an amplifier. Moreover, the current consumption is controlled in accordance with an undesired signal power level, thereby adjusting the value of OIP3.

If both the desired signal power level and the undesired signal power level are within their respective tolerances (i.e., if the high frequency variable gain amplification device 100 receives, from the control device 200, a control signal indicating that the desired signal power level does not exceed the first desired signal predetermined value t1, and the undesired signal power level does not exceed the first undesired signal predetermined value E1), the feedback circuit 103 reduces the feedback impedance, thereby increasing the gain of the high frequency variable gain amplification device 100 (see step S105 in FIG. 4 and point a in FIGS. 5A and 5B).

If the desired signal power level is within the tolerance thereof but the undesired signal power level exceeds the tolerance thereof (i.e., if the high frequency variable gain amplification device 100 receives, from the control device 200, a control signal indicating that the desired signal power level does not exceed the first desired signal predetermined value t1, and the undesired signal power level exceeds the first undesired signal predetermined value E1), the feedback circuit 103 reduces the feedback impedance, thereby increasing the gain of the high frequency variable gain amplification device 100. Further, the current consumption adjustment circuit 102 increases the current consumption, thereby increasing the value of OIP3 (see step S104 in FIG. 4 and transition from point a to point g shown in FIGS. 5A and 5B).

If the desired signal power level exceeds the tolerance thereof (i.e., if the high frequency variable gain amplification device 100 receives, from the control device 200, a control signal indicating that the desired signal power level exceeds the first desired signal predetermined value t1), the desired signal power level is determined by a grading scale.

Consider a case where the desired signal power level is in the range between the first desired signal predetermined value t1 and the second desired signal predetermined value t2, i.e., the desired signal power level exceeds the first desired signal predetermined value t1 but does not exceed the second desired signal predetermined value t2, (hereinafter, such a case is referred to by the term "first power state"). In the first power state, if the undesired signal power level exceeds the second undesired signal predetermined value E2 (i.e., if the high frequency variable gain amplification device 100 receives, from the control device 200, a control signal indicating that the undesired signal power level exceeds the second undesired signal predetermined value E2), the feedback circuit 103 increases the feedback impedance, thereby reducing the gain of the high frequency variable gain amplification device 100, while increasing the value of OIP3 (see step S109 in FIG. 4 and point a in FIGS. 5A and 5B). Thus, the gain is reduced, while improving the distortion characteristic.

In the first power state, if the undesired signal power level does not exceed the second undesired signal predetermined value E2 (i.e., if the high frequency variable gain amplification device 100 receives, from the control device 200, a control signal indicating that the undesired signal power level does not exceed the second undesired signal predetermined value E2), the influence of the undesired signal is insignificant, and therefore the current consumption can be reduced. Accordingly, the feedback circuit 103 increases the feedback impedance, thereby reducing the gain of the high frequency variable gain amplification device 100. Moreover, the current consumption adjustment circuit 102 reduces the current consumption until the value of OIP3 reaches a tolerable level (see step S110 in FIG. 4 and transition from point c to point d shown in FIGS. 5A and 5B). Thus, the gain is reduced, while maintaining the distortion characteristic.

Next, consider a case where the desired signal power level exceeds the second desired signal predetermined value t2, i.e., the desired signal power level exceeds the first desired signal predetermined value t1 and further exceeds the second desired signal predetermined value t2, (hereinafter, such a case is referred to by the term "second power state"). In the second power state, if the undesired signal power level exceeds the third undesired signal predetermined value E3 (i.e., if the high frequency variable gain amplification device 100 receives, from the control device 200, a control signal indicating that the undesired signal power level exceeds the third undesired signal predetermined value E3), the feedback circuit 103 further increases the feedback impedance, thereby further reducing the gain of the high frequency variable gain amplification device 100, while increasing the value of OIP3 (see step S113 in FIG. 4 and point f in FIGS. 5A and 5B). Thus, the gain is reduced, while improving the distortion characteristic.

In the second power state, if the undesired signal power level does not exceed the third undesired signal predetermined value E3 (i.e., if the high frequency variable gain amplification device 100 receives, from the control device 200, a control signal indicating that the undesired signal power level does not exceed the third undesired signal predetermined value E3), the influence of the undesired signal is insignificant, and therefore the current consumption can be reduced. Accordingly, the feedback circuit 103 further increases the feedback impedance, thereby further reducing the gain of the high frequency variable gain amplification device 100. Moreover, the current consumption adjustment circuit 102 reduces the current consumption until the value of OIP3 reaches a tolerable level (see step S114 in FIG. 4 and transition from point f to point e shown in FIGS. 5A and 5B). Thus, the gain is reduced, while maintaining the distortion characteristic.

Note that in general, if the power level of a received signal is increased, the influence of IM3 on the received signal is reduced, and therefore it is possible to set the third undesired signal predetermined value E3 so as to be greater than the second undesired signal predetermined value E2. Accordingly, the relationship between E2 and E3 may be E2<E3. When an undesired signal is lower than a predetermined value, the influence of the undesired signal is insignificant, and therefore it is possible to reduce the current consumption.

In the first embodiment, the amount of current consumption reduced in step S114 corresponds to an amount of transition from point c to point d shown in FIG. 5A. However, it is possible to reduce the current consumption more than the amount of transition. The reason for this is that as shown in FIG. 5B, OIP3 at point e is satisfactorily high, and therefore even if the current consumption is further reduced, OIP3 is maintained at the same level as that of point a. In this case, however, the current consumption is required to be adjusted in four levels, and therefore a further series circuit including a DC switch and a resistor is required to be provided so as to be connected in parallel with a series circuit including the second DC switch S2 and the second resistor R2 and another series circuit including the third DC switch S3 and the third resistor R3. Note that a resistance value of the resistor in the further series circuit is different from the resistance values of the second and third resistors R2 and R3. The first embodiment has been described with respect to a case where the switches 113a and 114a are not turned on simultaneously. However, the switches 113a and 114a may be turned on simultaneously. By turning on the switches 113a and 114a simultaneously, the feedback circuit 103 acts as a resistor circuit including the first and second resistors 123a and 123b. Accordingly, the impedance of the feedback circuit 103 becomes less than the impedance of the first resistor 123a, and therefore the feedback impedance is reduced to a fourth level less than the third level. In this manner, where the feedback circuit including two impedance circuits and two switch circuits is formed by turning on the two switch circuits simultaneously, it is possible to adjust the feedback impedance in four levels.

A still further series circuit including a DC switch and a resistor may be provided to divide the current consumption into further levels (i.e., five or more levels). In this case, no DC switch, one DC switch, or all DC switches are selectively turned on, thereby allowing the feedback impedance to be divided into a considerable number of levels using a small number of elements.

In the first embodiment, a desired signal power level is divided into two parts, i.e., the first and second desired signal predetermined values, and if the desired signal power level exceeds the second desired signal predetermined value, the feedback impedance is increased. However, the desired signal power level may be kept constant at the first input predetermined value. Alternatively, the desired signal power level may be minutely divided into parts, i.e., three parts or more, such that the feedback impedance can be adjusted in accordance with the minutely-divided parts. In this case, the feedback circuit may include a plurality of sets of resistors and switches, or the feedback impedance may be adjusted by, for example, a variable resistor.

Note that the frequency converter 300 does not have to be provided between the high frequency variable gain amplification device 100 and the channel selection filter 400.

Note that the channel filter 400 may be provided between an output terminal of the high frequency variable gain amplification device 100 and an input terminal of the frequency converter 300. In this case, a power level detected by the second power detection device 203 corresponds to the sum of a power level of a desired signal amplified by the high frequency variable gain amplification device 100 and a power level of an undesired signal attenuated by the channel selection filter 400.

Note that the first power detection device 202 may be connected to an output terminal P2 of the high frequency variable gain amplification device 100. In this case, it is possible for the control circuit 201 to obtain the magnitude of the desired signal at the output terminal P2 of the high frequency variable gain amplification device 100 based on the attenuation of the channel selection filter 400. The high frequency variable gain amplification device 100 may be controlled based on the obtained magnitude.

Figure 6:
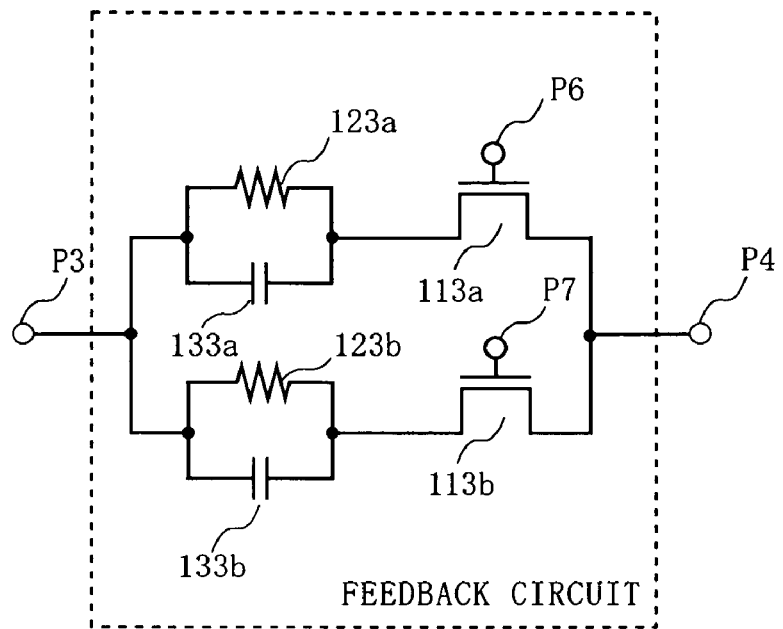
FIG. 6 is a diagram showing another exemplary structure of a feedback circuit.

Note that the structure of the feedback circuit 103 is not limited to that shown in FIG. 2. FIG. 6 is a diagram showing another exemplary structure of the feedback circuit 103. The exemplary feedback circuit shown in FIG. 6 includes an impedance circuit is formed by the first resistor 123a and the first capacitor 133a which are connected in parallel with each other, and another impedance circuit is formed by the first resistor 123a and the first capacitor 133a which are connected in parallel with each other. A feedback circuit structured as shown in FIG. 6 is capable of adjusting the phase of a feedback signal such that the feedback signal is approximately 180 degrees out of phase with an input signal. Thus, it is possible to cancel a distortion component, thereby further improving the distortion characteristic.

Note that although parallel circuits in the exemplary feedback shown in FIG. 6 each are formed by a combination of a resistor and a capacitor, each of the parallel circuits may be formed by a combination of a resistor and an inductor.

Figure 7:
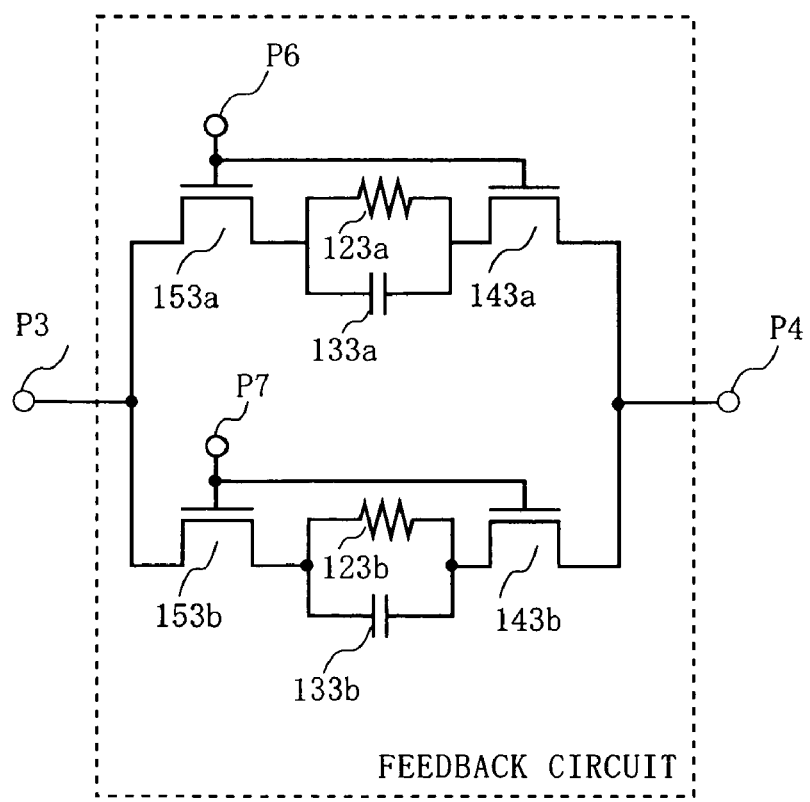
FIG. 7 is a diagram showing still another exemplary structure of the feedback circuit.

FIG. 7 is a diagram showing still another exemplary structure of the feedback circuit 103. In the exemplary feedback circuit shown in FIG. 7, a pair of first and third feedback path switches 143a and 153a located so as to sandwich a parallel circuit are turned on/off simultaneously, and another pair of second and fourth feedback path switches 143b and 153b located so as to sandwich a parallel circuit are turned on/off simultaneously. This improves a noise characteristic of the feedback circuit. Specifically, in an exemplary case where the first and third feedback path switches 143a and 153a are on and second and fourth feedback path switches 143a and 153a are off, thermal noise generated by the first resistor 123a is not inputted into the amplifier 101 via the input terminal P3 thereof since the fourth feedback path switch 153b is off. Thus, the noise characteristic is improved.

FIG. 8 is a diagram showing still another exemplary structure of the feedback circuit 103. The exemplary feedback circuit shown in FIG. 8 includes first and second direct current (DC) capacitors 163 and 173, a variable-capacitance diode 183, and a variable voltage source 193 connected to both ends of the variable-capacitance diode 183. The variable voltage source 193 is operable to supply a variable voltage to the variable-capacitance diode 183. If the field intensity of an input signal supplied to the input terminal P1 of the amplifier 101 is weak, the control circuit 201 adjusts a reverse bias voltage to be applied to the variable-capacitance diode 183 so as to reduce the capacity of the variable-capacitance diode, thereby increasing the feedback impedance of the feedback circuit. As a result, the amount of feedback signal is reduced, thereby allowing the amplifier 101 to be high-gain. If the desired signal is increased, the control circuit 201 adjusts voltage supplied by the variable voltage source 193 to increase the capacity of the variable-capacitance diode 183, thereby reducing the feedback impedance of the feedback circuit to reduce the gain of the amplifier 101. The first and second DC capacitors 163 and 173 separate a bias voltage to be applied to the amplifier 101 and the reverse bias voltage to be applied to the variable-capacitance diode 183, allowing the amplifier 101 and the variable-capacitance diode 183 to stably operate without influencing each other by voltage applied thereto.

Note that a control signal provided by the control circuit 201 may be a variable voltage for directly driving the variable-capacitance diode 183. In this case, the variable voltage source 193 may not be provided.

Note that in the first embodiment, the terminals P1 through P7 may be pad electrodes or nodes, such as element connections in wiring.

Note that although the first embodiment has been described with respect to a case where the amplifier 101 includes transistors connected in a cascode configuration, the transistors may not be connected in a cascode configuration.

Note that although the first embodiment has been described with respect to a case where a current consumption adjustment circuit includes two sets of series circuits each including a DC switch and a resistor which are connected in parallel with each other, the present invention is not limited to such a current consumption adjustment circuit. For example, the current consumption adjustment circuit may be configured as shown in FIGS. 6, 7, and 8 to adjust the feedback impedance, thereby adjusting the current consumption.

Note that although the first embodiment has been described with respect to a case where in step S101, the control device 200 determines a power level of an inputted desired signal, a power level of an input signal containing an undesired signal, as well as the power level of the inputted desired signal, may be determined for adjusting the feedback impedance.

Second Embodiment

Figure 9:
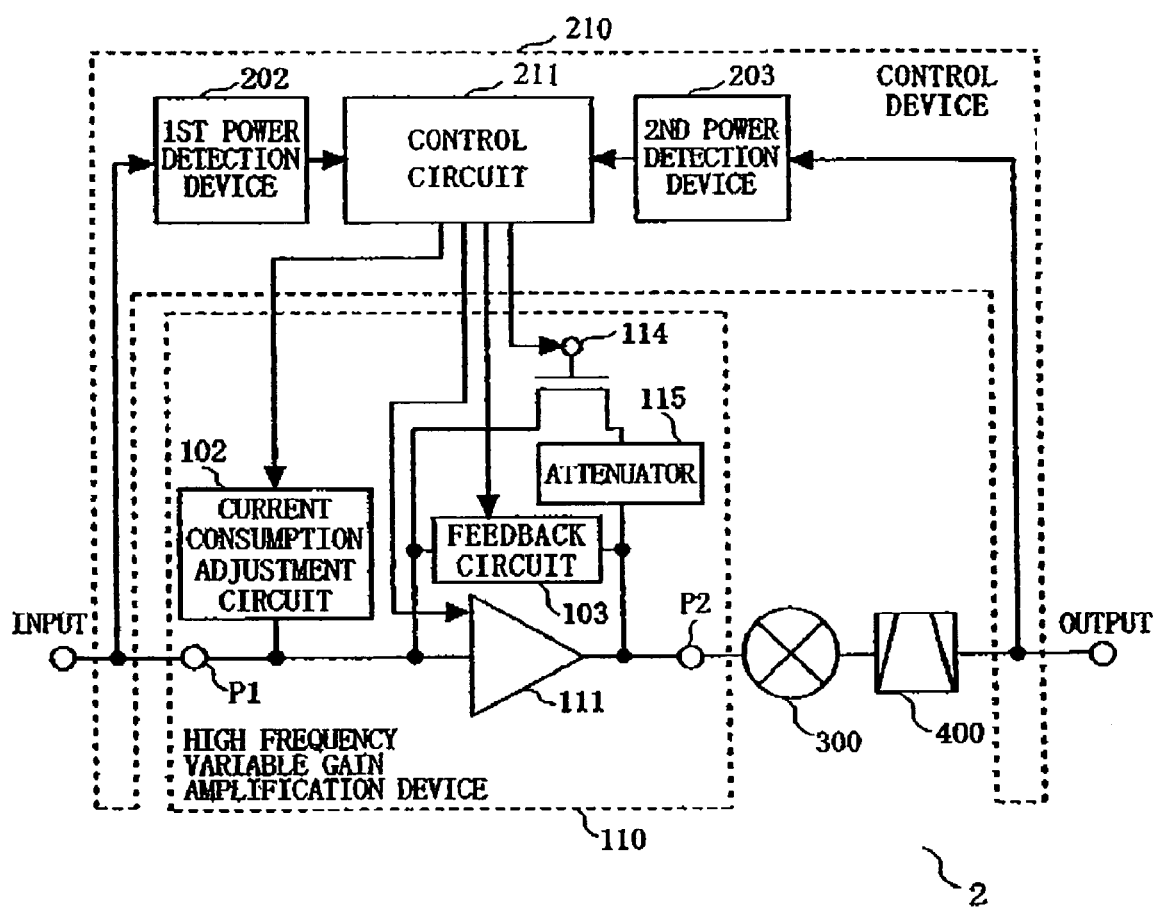
FIG. 9 is a block diagram showing a structure of an amplification circuit 2 according to a second embodiment of the present invention.

FIG. 9 is a block diagram showing a structure of an amplification circuit 2 according to a second embodiment of the present invention. The amplification circuit 2 shown in FIG. 9 includes a high frequency variable gain amplification device 110, a control device 210, the frequency converter 300, and the channel selection filter 400. In FIG. 9, elements similar to those included in the amplification circuit 1 according to the first embodiment are denoted by the same reference numerals, and the detailed descriptions thereof are omitted herein.

The high frequency variable gain amplification device 110 includes an input terminal P1, an output terminal P2, an amplifier 111, the current consumption adjustment circuit 102, a feedback circuit 103, a mode change switch 114, and an attenuator 115. The mode change switch 114 is operable to cause an input signal to bypass the amplifier 111 so as to flow to the output side of the amplifier 111 in accordance with an instruction from the control circuit 211. The attenuator 115 is operable to cause the input signal to flow to the output side of the amplifier 111. The mode change switch 114 and the attenuator 115 collectively function as a bypass circuit.

The control device 210 includes a control circuit 211, the first power detection device 202, and the second power detection device 203. The control circuit 211 is operable to control the current consumption adjustment circuit 102, the feedback circuit 103, and the mode change switch 114 in accordance with power levels detected by the first and second power detection devices 202 and 203.

Figure 10:
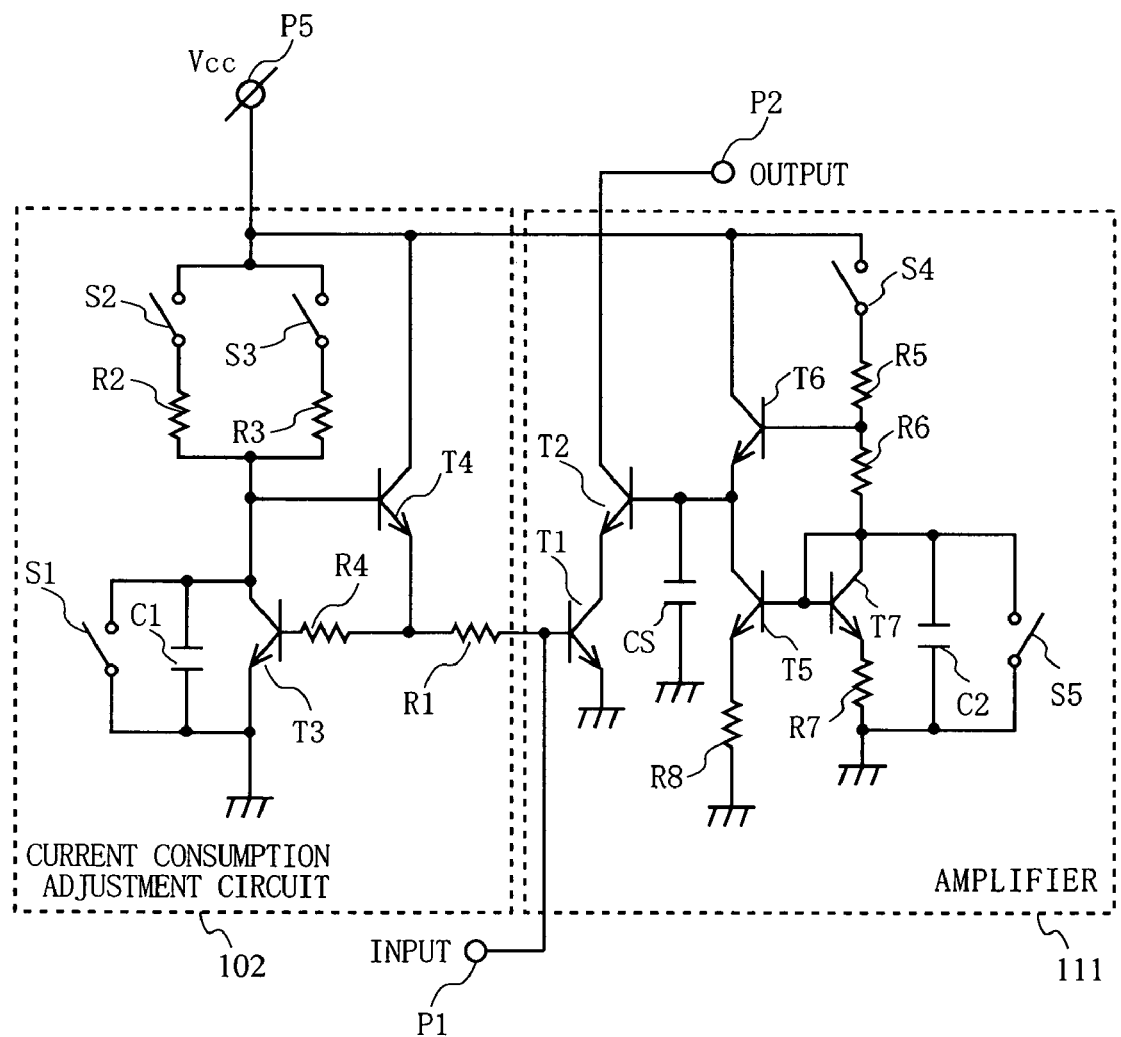
FIG. 10 is a circuit diagram showing an internal structure of each of an amplifier 111 and the current consumption adjustment circuit 102.

FIG. 10 is a circuit diagram showing an internal structure of each of the amplifier 111 and the current consumption adjustment circuit 102. In FIG. 10, elements similar to those shown in FIG. 3 are denoted by the same reference numerals, and the detailed descriptions thereof are omitted herein.

In FIG. 10, the amplifier 111 includes the first bipolar transistor T1, the second bipolar transistor T2, fifth through seventh bipolar transistors T5 through T7, the ground capacitor CS, a second capacitor C2, fifth through eighth resistors R5 through R8, and fourth and fifth DC switches S4 and S5.

An emitter of the fifth bipolar transistor T5 is grounded via the eighth resistor R8. A collector of the fifth bipolar transistor T5 is connected to the base of the second bipolar transistor T2 and an emitter of the sixth bipolar transistor T6. A base of the sixth bipolar transistor T6 is connected to a common terminal of the fifth and sixth resistors R5 and R6 which are connected in series with each other. Another terminal of the fifth resistor R5 is connected to the power supply terminal P5 via the fourth DC switch S4. Another terminal of the sixth resistor R6 is connected to a collector of the seventh bipolar transistor T7.

A base of the seventh bipolar transistor T7 is connected to a base of the fifth bipolar transistor T5. The base and the collector of the seventh bipolar transistor T7 are connected with each other. Connected between the collector and an emitter of the seventh bipolar transistor T7 is a parallel circuit including the second capacitor C2 and the fifth DC switch S5. The emitter of the seventh bipolar transistor T7 is grounded via the seventh resistor R7.

The fourth and fifth DC switches S4 and S5 are, for example, n-channel FET switches.

In the circuit shown in FIG. 10, the first and second bipolar transistors T1 and T2 are switched between an amplification operation and an off operation by controlling on/off of the first through fifth DC switches S2 and S3.

In order to switch the first and second bipolar transistors T1 and T2 into the amplification operation, it is necessary that the first and fifth DC switches S1 and S5 are on, the fourth DC switch is off, and at least one of the second and third DC switches are on.

In order to switch the first and second bipolar transistors T1 and T2 into the off operation, it is necessary that the first and fifth DC switches S1 and S5 are on, and the second through fourth DC switches are off. A switch circuit for making a switch into the off operation is referred to below as an "off circuit".

Hereinbelow, the amplification and off operations are described in detail.

In the case where switching to the amplification operation is performed in a manner as described above, a base bias voltage of the first bipolar transistor T1 becomes approximately 0.7 volts. If resistance values of the fifth through seventh resistors R5 through R7 are r5, r6, and r7, respectively, a base bias voltage Vb of the second bipolar transistor T2 is represented by the following expression (1), $$Vb=(Vcc-0.7)(r6+r7)/(r5+r6+r7) \qquad (1).$$

Note that it is assumed here that the third DC switch S3 is on.

The base bias voltages as described above turn on the first and second bipolar transistors T1 and T2, and therefore the amplifier 111 is allowed to amplify an input signal and output the amplified input signal.

In this case, if resistance values of the first, second, and fourth resistors R1, R2, and R4 are r1, R, and r4, respectively, and a current amplification factor of each of the first and third bipolar transistors T1 and T3 is hfe, current consumption I of the amplifier 111, which includes the first and second bipolar transistors T1 and T2 connected in a cascode configuration, is represented by the following expression (2), $$I=(r4/r1)(Vcc-1.4)/(R+r4/hfe) \qquad (2).$$

Note that it is assumed here that the second DC switch S2 is on, and a voltage between a base and an emitter of any bipolar transistor, which is on, is 0.7 volts.

It is apparent from the above expression (2) that current consumption of a cascode amplifier varies depending on the value of R. Thus, it is apparent that the value of R is allowed to vary by connecting the second and third resistors R2 and R3 in parallel with each other as shown in FIG. 10. In order select the resistance value R, at least one of the second and third DC switches S2 and S3 are turned on. For example, in the case where the second DC switch S2 is on, R in the above expression (2) corresponds to the resistance value of the second resistor R2 connected to the second DC switch S2. In the case where the third DC switch S3 is on, R in the above expression (2) corresponds to the resistance value of the third resistor R3 connected to the second DC switch S3. In the case where both the second and third DC switches S2 and S3 are on, R in the above expression (2) corresponds to a resistance value when the second and third resistors R2 and R3 are connected in parallel with each other. The second and third resistors R2 and R3 are set so as to differ in a resistance value from each other, and therefore it is possible to allow the resistance value R to vary, thereby adjusting the current consumption of the amplifier 111. In order to reduce the current consumption, one of two current consumption adjustment DC switches, which is connected to a resistor having a greater resistance value, is turned on.

In the case of switching to the off operation, the first and fifth DC switches S1 and S5 are on, and the second through fourth DC switches are off, so that the base bias voltage of each of the first and second bipolar transistors T1 and T2 becomes approximately zero volts. In this case, the amplifier 111 is turned off, and therefore there is no current consumption.

Figure 11:
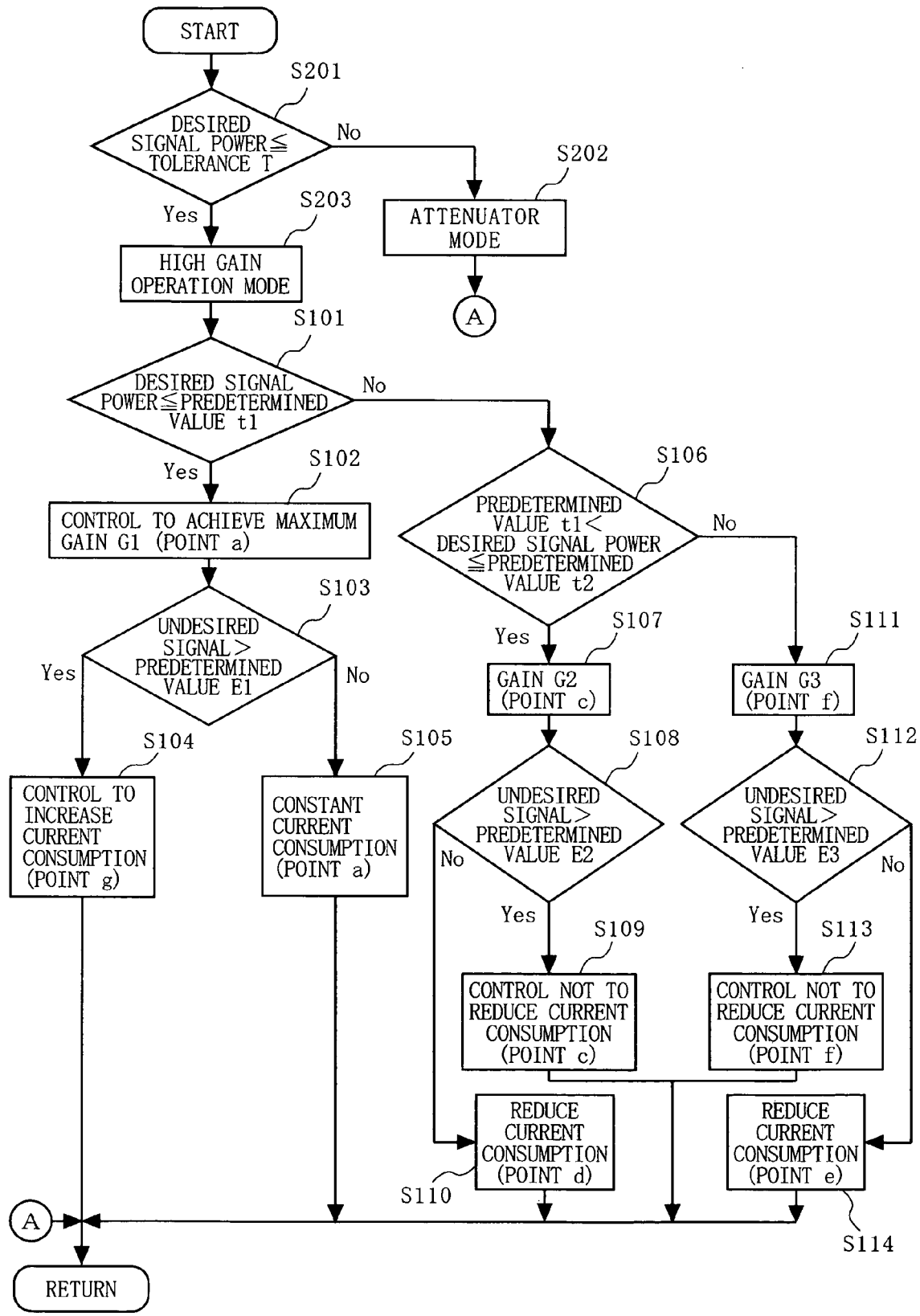
FIG. 11 is a flowchart showing an operation of a control circuit 211 according to the second embodiment.

FIG. 11 is a flowchart showing an operation of the control circuit 211 according to the second embodiment. Hereinbelow, a method for controlling the high frequency variable gain amplification device 110 is described with reference to FIG. 11. In FIG. 11, steps similar to those described in the first embodiment are denoted by the same step numbers shown in FIG. 4.

Initially, the control circuit 211 determines whether a desired signal power level detected by the first power detection device 202 is less than or equal to a tolerance T (step S201). The desired signal power level is obtained in a manner as described in the first embodiment.

If the desired signal power level is determined to be less than or equal to the tolerance T, the control circuit 211 performs switching so as to cause the amplifier 101 to perform an amplification operation (step S203). The above-described case where the amplifier 101 performs the amplification operation is referred to by the term "high gain operation mode". Specifically, as described above, the first and fifth DC switches are turned on, and the fourth DC switch is turned off. Thereafter, as in the first embodiment, the control circuit 211 controls the feedback circuit 103 and the current consumption adjustment circuit 102 in accordance with a desired signal power level and an undesired signal power level (steps S101 through S114), thereby preventing the distortion characteristic from being reduced.

In the case where the desired signal power level is determined to exceed the tolerance T, i.e., the desired power level is considerably high, it is not necessary to amplify the desired signal power level. Accordingly, the control circuit 211 controls the amplifier 101, the feedback circuit 103, and the mode change switch 114, such that the amplifier 101 performs an off operation, the feedback circuit 103 becomes open, and the mode change switch 114 is turned on (step S202). Thereafter, the procedure returns to step S201. A mode in which the amplifier 101 performs an off operation, the mode change switch 114 is turned on, and the desired signal is outputted via the attenuator 115 is referred to below as an "attenuator mode".

Specifically, the control circuit 211 turns on the first and fifth DC switches S1 and S5, and turns off the second through fourth DC switches S2 through S4, thereby turning off the amplifier 101. Moreover, the control circuit 211 turns off the first and second switches 113a and 113b, thereby turning off the feedback circuit 103.

This allows the desired signal inputted into the input terminal P1 to be outputted from the output terminal P2 after passage through the mode change switch 114 and the attenuator 115, so that the desired signal is attenuated more than at the time the desired signal is inputted.

As described above, in the second embodiment, if the field intensity of the received signal exceeds a tolerance, the amplifier 101 is turned off, so that a distortion component, which is generated when the amplifier 101 is saturated, can be reduced to substantially zero. Moreover, by attenuating the desired signal using the attenuator 115, it is made possible to prevent a distortion component from being generated due to saturation of a circuit located downstream in the high frequency variable gain amplification device 110 even if a high field intensity is inputted to the high frequency variable gain amplification device 110. As a result, it is possible to provide a low distortion, and high dynamic range variable gain amplification device.

Note that the feedback circuit in the second embodiment may be any one of the feedback circuits shown in FIGS. 6, 7, and 8.

Note that in the case where the desired signal power exceeds the tolerance T, a bypass from an input side to an output side may be provided without providing amplification.

Note that two or more bypass circuits may be connected in parallel with each other, such that switching between bypass paths is performed by switches, thereby changing the amount of attenuation in a bypass mode.

Note that the channel selection filter 400 may be provided between an output terminal of the high frequency variable gain amplification device 100 and an input terminal of the frequency converter 300. In this case, a power level detected by the second power detection device 203 corresponds to the sum of a power level of a desired signal amplified by the high frequency variable gain amplification device 100 and a power level of an undesired signal attenuated by the channel selection filter 400.

Third Embodiment

Figure 12:
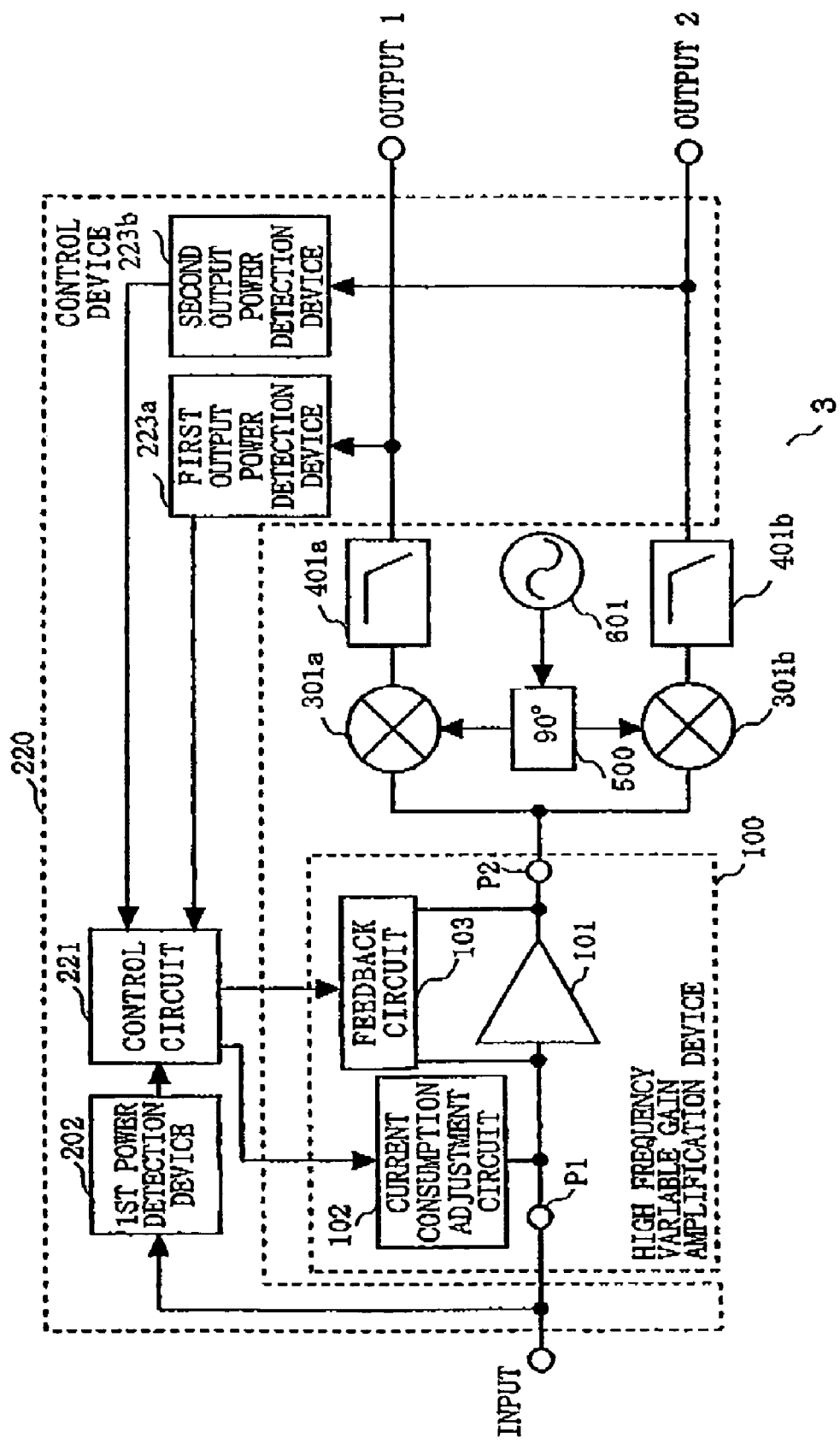
FIG. 12 is a block diagram showing a structure of an amplification circuit 3 according to a third embodiment of the present invention.

FIG. 12 is a block diagram showing a structure of an amplification circuit 3 according to a third embodiment of the present invention. In the third embodiment, an operation is described with reference to the flowchart of FIG. 4. The amplification circuit 3 is of a direct conversion type. In FIG. 12, elements similar to those of the amplification circuit 1 shown in FIG. 1 are denoted by the same reference numerals, and the detailed descriptions thereof are omitted herein. In FIG. 12, the amplification circuit 3 includes the high frequency variable gain amplification device 100, a control device 220, mixers 301a and 301b, low pass filters 401a and 401b, a 90 degree phase shifter 500, and a local oscillator 601. The control device 220 includes a control circuit 221, a first power detection device 202, and first and second output power detection circuits 223a and 223b.

Output signals of the local oscillator 601 are caused by the 90 degree phase shifter 500 to become local signals which are 90 degrees out of phase with each other, and inputted into the mixers 301a and 301b, respectively. Each of the mixers 301a and 301b multiplies a local signal from the 90 degree phase shifter by an output signal from the high frequency variable gain amplification device 100, and a resultant signal is inputted into the low pass filter 401a or 401b. The low pass filter 401a selects desired signals from output signals from the mixer 301a, allows the selected signal to pass therethrough, thereby attenuating an undesired signal, and outputs a quadrature signal and an in-phase signal. The low pass filter 401b selects desired signals from output signals from the mixer 301b, allows the selected signal to pass therethrough, thereby attenuating an undesired signal, and outputs a quadrature signal and an in-phase signal.

The first output power detection circuit 223a detects a power level of an output signal from the low pass filter 401a. The second output power detection circuit 223b detects a power level of an output signal from the low pass filter 401b. As in the first embodiment (see FIG. 4), the control circuit 221 controls the feedback impedance and the current consumption based on an undesired signal power level obtained based on a desired signal power level detected by the first power detection device 202 and the power levels of the output signals detected by the first and second output power detection circuits 223a and 223b.

Fourth Embodiment

FIG. 13 is a block diagram showing a structure of a frequency conversion circuit 4 according to a fourth embodiment of the present invention. In FIG. 13, the frequency conversion circuit 3 includes a high frequency variable gain frequency-conversion device 120, the control device 200, and the channel selection filter 400. The high frequency variable gain frequency-conversion device 120 includes a frequency converter 800, an input port P1, an output port P2, a local frequency signal input port LO, the feedback circuit 103, and the current consumption adjustment circuit 102.

In FIG. 13, elements similar to those of the amplification circuit 1 shown in FIG. 1 are denoted by the same reference numerals, and the detailed descriptions thereof are omitted herein. In FIG. 13, the frequency conversion circuit 4 includes the high frequency variable gain frequency-conversion device 120, instead of including the high frequency variable gain amplification device 100, and does not include the frequency converter 300.

From the local frequency signal input port LO, a local frequency signal is inputted. The frequency converter 800 multiplies the local signal inputted from the local frequency signal input port LO by a high frequency signal inputted from the input port P1, and outputs a resultant signal from the output port P2.

Similar to the first embodiment, the control circuit 201 inputs a control signal into each of the feedback circuit 103 and the current consumption adjustment circuit 102, and adjusts the feedback impedance and the current consumption of the frequency converter 800.

FIG. 14 is a circuit diagram showing an internal structure of each of the frequency converter 800 and the current consumption adjustment circuit 102. In FIG. 14, the current consumption adjustment circuit 102 is similar to that described in the first embodiment, and the detailed descriptions thereof are omitted here. The frequency converter 800 includes a bipolar transistor T5, the local frequency signal input port LO, an input port P3, and an output port P4. A high frequency signal inputted from the input port P3 is multiplied by a local frequency signal inputted from the local frequency signal input port LO, and a resultant signal is outputted from the output port P4.

Thus, in the fourth embodiment, the feedback impedance is controlled so as to adjust the gain of the frequency converter 800 in accordance with a power level of a received desired signal. Moreover, the current consumption is controlled so as to adjust the value of OIP3 in accordance with an undesired signal power level. Therefore, it is possible to provide a high frequency variable gain frequency-conversion device capable of preventing the distortion characteristic from being reduced, while reducing the current consumption.

Figure 15:
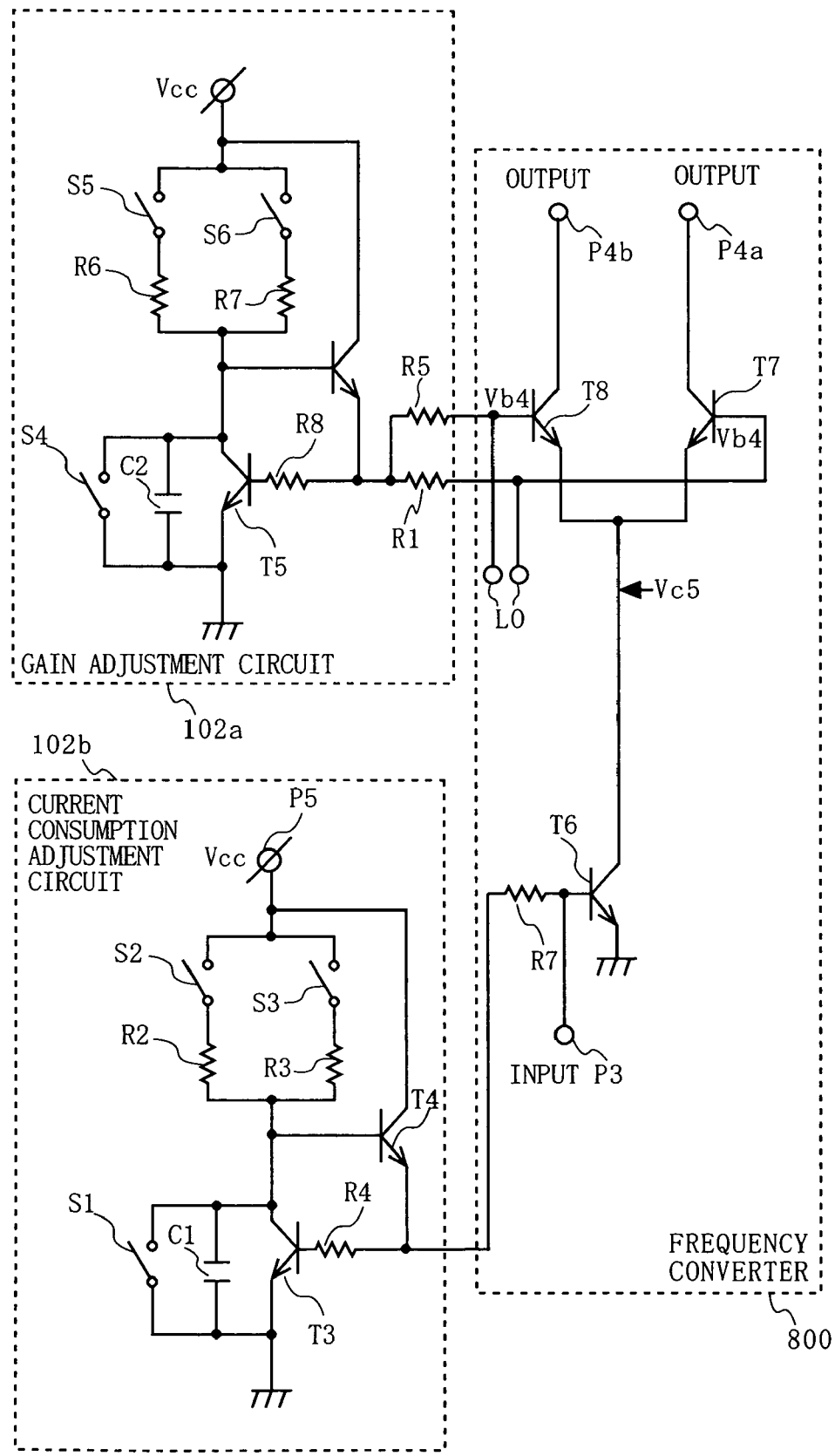
FIG. 15 is a circuit diagram showing an internal structure of each of the frequency converter 800, a gain adjustment circuit 102a, and a current consumption adjustment circuit 102b in the case of using a balance-type frequency converter.

Note that although the fourth embodiment has been described with respect to a case where the frequency converter is of a single type, a balance-type frequency converter may be used. FIG. 15 is a circuit diagram showing an internal structure of each of the frequency converter 800, a gain adjustment circuit 102a, and a current consumption adjustment circuit 102b in the case of using the balance-type frequency converter. In FIG. 15, the balance-type frequency converter includes transistors T6, T7, and T8, a resistor R7, an input port P3, output ports P4a and P4b, and the local frequency signal input port LO. To the local frequency signal input port LO, a differential local frequency signal is inputted. The differential frequency signal is multiplied by a high frequency signal inputted from the input port P3 at each of the transistors T7 and T8, and resultant signals are outputted from the output ports P4a and P4b.

The gain adjustment circuit 102a having a circuit structure similar to that of the current consumption adjustment circuit 102 described in the first embodiment is connected to the transistors T7 and T8. Note that the resistors R6, R7, and R8 each have a suitable resistance value. The gain adjustment circuit 102a is connected to a base of the transistor T8 via the resistor R5, and to a base of the transistor T7 via the resistor R1.

The current consumption adjustment circuit 102b having a circuit structure similar to that of the current consumption adjustment circuit 102 described in the first embodiment is connected to the transistor T6. Note that the resistors R2, R3, and R4 each have a suitable resistance value. The current consumption adjustment circuit 102b is connected to a base of the transistor T6 via the resistor R7.

In this case, a first feedback circuit (not shown) is connected between the output port P4a and the input port P3, and a second feedback circuit (not shown) is connected between the output port P4b and the input port P3.

If it is determined the gain is required to be changed (see steps S102, S107, and S111 of FIG. 4), the control circuit 201 of the control device 200 adjusts feedback impedances of the first and second feedback circuits, such that each of the feedback impedances of the first and second feedback circuits is directed as in the first embodiment, and inputs control signals to the gain adjustment circuit 102a to control the switches S5 and S6, thereby changing the gain of the frequency converter 800. If a base voltage Vb4 of each of the transistors T7 and T8 is changed, a saturation output level is changed. A change of the saturation output level corresponds to a change of a maximum possible output power, and therefore by changing the saturation output level, it is possible to change the gain. Specifically, in order to increase the gain, the base voltage Vb4 of each of the transistors T7 and T8 is required to be reduced. Therefore, the control circuit 201 controls the switches S5 and S6 so as to increase the resistance of the entire circuit including the resistors R6 and R7. On the other hand, in order to decrease the gain, the base voltage Vb4 of each of the transistors T7 and T8 is required to be increased. Therefore, the control circuit 201 controls the switches S5 and S6 so as to decrease the resistance of the entire circuit including the resistors R6 and R7. Note that the base voltage Vb4 of each of the transistors T7 and T8 is controlled so as not to be less than or equal to an emitter voltage Vc5. In this manner, the feedback impedances of the first and second feedback circuits and the impedance of the gain adjustment circuit are adjusted to adjust the gain of the frequency converter 800.

If it is determined the current consumption is required to be changed (see steps S104, S110, and S114 of FIG. 4), the control circuit 201 of the control device 200 inputs a control signal to the gain adjustment circuit 102b to control the switches S2 and S3 in a manner similar to the first embodiment, thereby changing the current consumption of the frequency converter 800.

As described above, the frequency converter may be of a balance type. In this case, by providing a further gain adjustment circuit, it is made possible to adjust the gain of the frequency converter. By adjusting the gain using the gain adjustment circuit as well as by adjusting the gain by means of a feedback impedance adjustment, it is made possible not only to merely adjust the gain but also to prevent distortion. Note that the gain may be adjusted only by the feedback circuit without providing the gain adjustment circuit.

Fifth Embodiment

Figure 16:
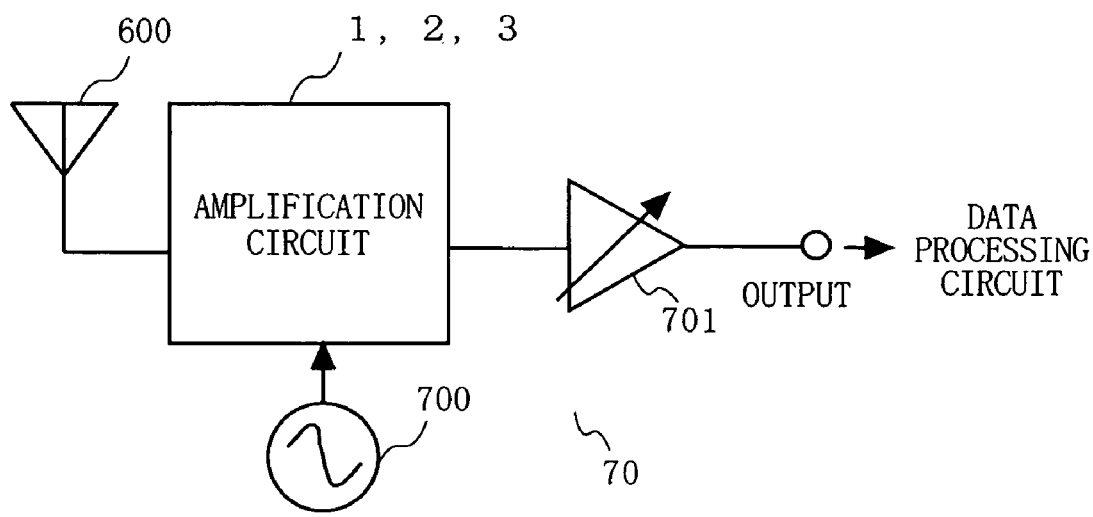
FIG. 16 is a block diagram showing a structure of a communication device 70 including an amplification circuit 1, 2, or 3 described in the first or second embodiment of the present invention.
Figure 17:
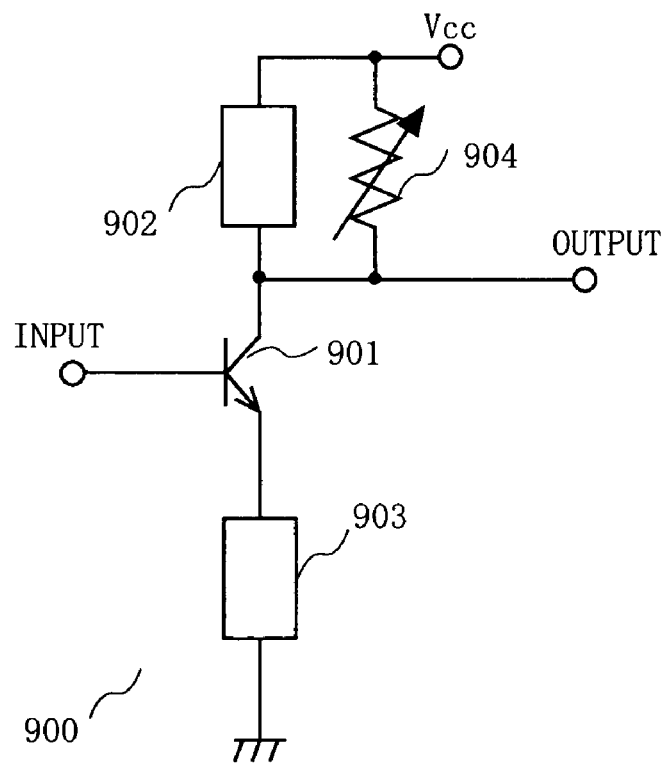
FIG. 17 is a diagram showing a structure of a conventional reception circuit 900 having a gain control function which is disclosed in Japanese Laid-Open Patent Publication No. 2002-016462.

FIG. 16 is a block diagram showing a structure of a communication device 70 including the amplification circuit 1, 2, or 3 described in the first or second embodiment of the present invention. Regardless of whether the communication device includes the amplification circuit 1, 2, or 3, the entire structure of the communication device is the same except that a local oscillator is not required in the case where the amplification circuit 3 is included. Hereinbelow, a structure of the communication device 70 including the amplification circuit 1 is described as a typical example of the communication device 70.

In FIG. 16, the communication device 70 includes an antenna 600, the amplification circuit 1, a local oscillator 700, and a variable gain amplification device 701. The antenna 600 is connected to an input terminal of the amplification circuit 1. The local oscillator 700 inputs a local oscillation signal to the frequency converter 300 of the amplification circuit 1. In this case, the frequency converter 300 acts as a mixer. On the output side of the communication device 70, a data processing circuit is essentially connected.

An input signal received by the antenna is amplified by the high frequency variable gain amplification device 100 of the amplification circuit 1. A differential signal having a frequency equivalent to a difference between the frequency of an output signal of the high frequency variable gain amplification device 100 and an oscillation frequency of the local oscillator 700 is inputted from the frequency converter 300 to the variable gain amplification device 701 and adjusted to a predetermined level, and a resultant signal is outputted from an output terminal of the communication device 70 and inputted to the data processing circuit.

Note that a filter for reducing an unwanted frequency component may be provided between adjacent circuit blocks.

Note that in a communication device, which includes a high frequency variable gain amplification device for amplifying a high frequency signal received by an antenna and outputting a resultant signal, and a frequency conversion device for frequency-converting the signal outputted from the high frequency variable gain amplification device, the frequency conversion device may be equivalent to that described in the fourth embodiment.

The present invention provides a high frequency variable gain amplification device, a control device, a high frequency variable gain frequency conversion device, and a communication device are capable of reducing the current consumption so as not to reduce the distortion characteristic or improving the distortion characteristic without increasing the current consumption, and thus are advantageous in, for example, the filed of communication.

While the invention has been described in detail, the foregoing description is in all aspects illustrative and not restrictive. It is understood that numerous other modifications and variations can be devised without departing from the scope of the invention.

What is claimed is:

1. A high frequency variable gain amplification device for causing gain to vary in accordance with a control signal externally provided thereto, the control signal including a first control signal and a second control signal, and for amplifying an input high frequency signal, the device comprising:
   an amplifier operable to amplify the input high frequency signal;
   a feedback circuit operable to cause a feedback impedance to vary in accordance with the first control signal, which is externally provided, the first control signal being associated with a desired signal power level of the input high frequency signal, and to cause an output signal of the amplifier to be fed back to an input side of the amplifier; and
   a current consumption adjustment circuit operable to adjust current consumption of the amplifier in accordance with the second control signal, which is externally provided, the second control signal being associated with an undesired signal power level of the input high frequency signal.

2. The high frequency variable gain amplification device according to claim 1,
   wherein the feedback circuit increases the feedback impedance if the first control signal indicates that the desired signal power level does not exceed a desired signal predetermined value, while the feedback circuit reduces the feedback impedance if the first control signal indicates that the desired signal power level exceeds the desired signal predetermined value, and
   wherein in the case where the desired signal power level exceeds the desired signal predetermined value, if the second control signal indicates that the undesired signal power level exceeds an undesired signal predetermined value, the current consumption adjustment circuit adjusts the current consumption of the amplifier so as not to reduce a distortion characteristic, and if the second control signal indicates that the undesired signal power level does not exceed the undesired signal predetermined value, the current consumption adjustment circuit reduces the current consumption of the amplifier.

3. The high frequency variable gain amplification device according to claim 1, further comprising:
   an off circuit operable to turn off the amplifier upon receipt of the first control signal if the first control signal indicates that the desired signal power level exceeds a predetermined tolerance; and
   a bypass circuit operable to attenuate the input high frequency signal, while causing the input high frequency signal to bypass the amplifier so as to flow to an output side of the amplifier upon receipt of the first control signal indicating that the desired signal power level exceeds the predetermined tolerance.

4. The high frequency variable gain amplification device according to claim 1,
   wherein the feedback circuit includes a plurality of impedance circuits connected in parallel with each other, the plurality of impedance circuits differing in impedance from each other; and
   wherein each of the plurality of impedance circuits has a switch circuit which is controlled so as to be tuned on or off in accordance with the first control signal.

5. The high frequency variable gain amplification device according to claim 4,
   wherein each of the plurality of impedance circuits is a parallel circuit including a resistor and a capacitor which are connected in parallel with each other,
   wherein the plurality of impedance circuits differ from each other with respect to a resistance value of the resistor, and
   wherein a feedback signal is reversed in phase by the parallel circuit.

6. The high frequency variable gain amplification device according to claim 4,
wherein the switch circuit includes two switches connected to either end of the impedance circuit, and
wherein the two switches are simultaneously turned off or on in accordance with the first control signal.

7. The high frequency variable gain amplification device according to claim 1,
wherein the feedback circuit includes a variable-capacitance diode, and
wherein the feedback impedance is adjusted by adjusting a reverse bias voltage of the variable-capacitance diode.

8. The high frequency variable gain amplification device according to claim 1,
wherein the amplifier includes first and second bipolar transistors,
wherein a collector of the first bipolar transistor is connected to an emitter of the second bipolar transistor, and
wherein an input signal inputted into a base of the first bipolar transistor is outputted from a collector of the second bipolar transistor.

9. The high frequency variable gain amplification device according to claim 1,
wherein the current consumption adjustment circuit includes a plurality of impedance circuits connected in parallel with each other, the plurality of impedance circuits differing in impedance from each other; and
wherein each of the plurality of impedance circuits has a switch circuit which is controlled so as to be turned on or off in accordance with the second control signal.

10. A communication device for receiving a high frequency signal, the communication device comprising a high frequency variable gain amplification device operable to amplify a high frequency signal received by an antenna of the communication device and to output the amplified high frequency signal,
wherein the high frequency variable gain amplification device is the high frequency variable gain amplification device according to claim 1.

11. The communication device according to claim 10, further comprising:
a frequency converter operable to frequency-convert an output signal from the high frequency variable gain amplification device; and
a variable gain amplification device operable to adjust gain of an output signal from the frequency converter to a predetermined level.

12. A communication device for receiving a high frequency signal, the communication device comprising a high frequency variable gain amplification device operable to amplify a high frequency signal received by an antenna of the communication device and to output the amplified high frequency signal,
wherein the high frequency variable gain amplification device is the high frequency variable gain amplification device according to claim 2.

13. A communication device for receiving a high frequency signal, the communication device comprising a high frequency variable gain amplification device operable to amplify a high frequency signal received by an antenna of the communication device and to output the amplified high frequency signal,
wherein the high frequency variable gain amplification device is the high frequency variable gain amplification device according to claim 3.

14. A control device for controlling a high frequency variable gain amplification device including an amplifier and a feedback circuit operable to cause an output signal of the amplifier to be fed back to an input side of the amplifier, the high frequency variable gain amplification device capable of adjusting current consumption of the amplifier and an impedance of the feedback circuit, the control device comprising:
a desired signal power level detection unit operable to detect a desired signal power level of a high frequency signal inputted into the high frequency variable gain amplification device;
an undesired signal power level detection unit operable to detect an undesired signal power level of an undesired component contained in an output signal from the high frequency variable gain amplification device;
a feedback impedance control unit operable to control a feedback impedance of the high frequency variable gain amplification device in accordance with the desired signal power level detected by the desired signal power level detection unit; and
a current consumption control unit operable to control the current consumption of the high frequency variable gain amplification device in accordance with the undesired signal power level detected by the undesired signal power level detection unit,
wherein if the desired signal power level does not exceed a desired signal predetermined value, the feedback impedance control unit controls the high frequency variable gain amplification device so as to increase the feedback impedance,
wherein if the desired signal power level exceeds the desired signal predetermined value, the feedback impedance control unit controls the high frequency variable gain amplification device so as to reduce the feedback impedance, and
wherein in the case where the desired signal power level exceeds the desired signal predetermined value, if the undesired signal power level exceeds an undesired signal predetermined value, the current consumption control unit controls the high frequency variable gain amplification device so as to adjust the current consumption to such an extent as not to reduce a distortion characteristic, and if the undesired signal power level does not exceed the undesired signal predetermined value, the current consumption control unit controls the high frequency variable gain amplification device so as to reduce the current consumption.

15. The control device according to claim 14, further comprising:
an off unit operable to turn off the high frequency variable gain amplification device if the desired signal power level exceeds a predetermined tolerance; and
a bypass unit operable to attenuate an input signal, while causing the input signal to bypass the amplifier so as to flow to an output side of the amplifier, if the desired signal power level exceeds the predetermined tolerance.

* * * * *